United States Patent
Ishiwata et al.

(10) Patent No.: US 7,678,510 B2
(45) Date of Patent: Mar. 16, 2010

(54) MASK FOR EXPOSURE AND METHOD OF MANUFACTURING THE SAME

(75) Inventors: Naoyuki Ishiwata, Kawasaki (JP); Koji Hosono, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 1042 days.

(21) Appl. No.: 11/017,196

(22) Filed: Dec. 21, 2004

(65) Prior Publication Data
US 2006/0057473 A1 Mar. 16, 2006

(30) Foreign Application Priority Data
Sep. 14, 2004 (JP) ............... 2004-266816

(51) Int. Cl.
*G03F 1/00* (2006.01)
(52) U.S. Cl. .......................... 430/5; 430/311
(58) Field of Classification Search ............ 430/5, 430/30, 311, 322–324; 382/144
See application file for complete search history.

(56) References Cited

U.S. PATENT DOCUMENTS

| | | | | |
|---|---|---|---|---|
| 5,698,348 A | * | 12/1997 | Nakao | 430/5 |
| 5,718,829 A | * | 2/1998 | Pierrat | 216/12 |
| 2003/0219655 A1 | * | 11/2003 | Sutani et al. | 430/5 |
| 2005/0112475 A1 | * | 5/2005 | Sato et al. | 430/5 |

FOREIGN PATENT DOCUMENTS

| | | |
|---|---|---|
| JP | 62-50811 | 10/1987 |
| JP | 9-258427 | 10/1997 |

OTHER PUBLICATIONS

English Translation of JP 09258427, Ikuo et al., Published Mar. 10, 1997.*

* cited by examiner

*Primary Examiner*—Mark F Huff
*Assistant Examiner*—Stewart A Fraser
(74) *Attorney, Agent, or Firm*—Fujitsu Patent Center

(57) ABSTRACT

There is provided a method of manufacturing a mask for exposure, which is capable of measuring the phase difference between a shifter portion and a non-shifter portion with good accuracy.

A mask for exposure having: two first light-shielding device patterns, which are formed on a quartz substrate (transparent substrate) in a device region at a first gap and extend over a first concave portion; a second device light-shielding pattern at a second gap from the first device light-shielding pattern; two first light-shielding monitor patterns, which are formed on the quartz substrate in a monitor region at a third gap wider than the first gap and extend over a second concave portion; and second light-shielding monitor pattern, which has a fourth gap wider than the second gap from the first light-shielding monitor pattern, in which the size of the first light-shielding monitor pattern is equal to or less than the size of the first light-shielding device pattern.

15 Claims, 21 Drawing Sheets

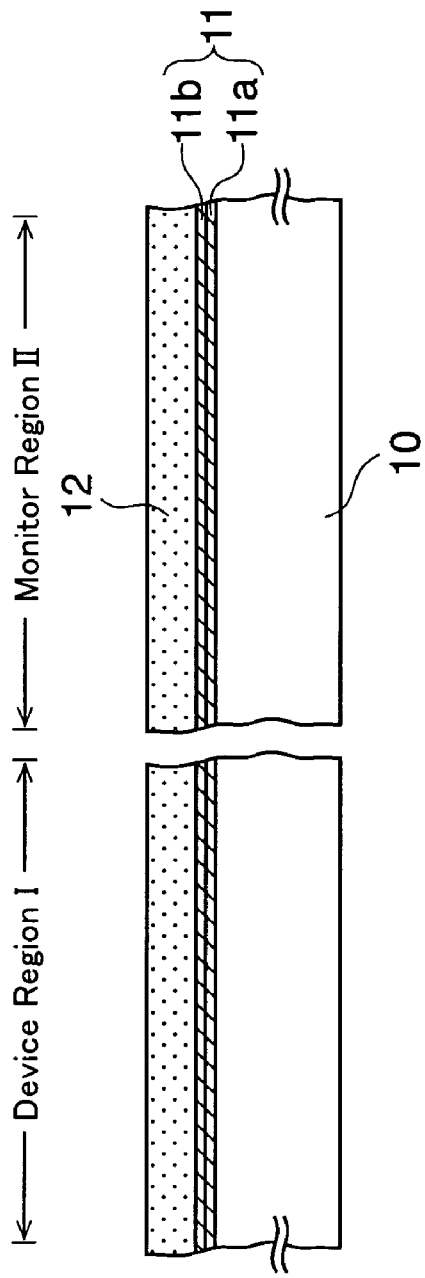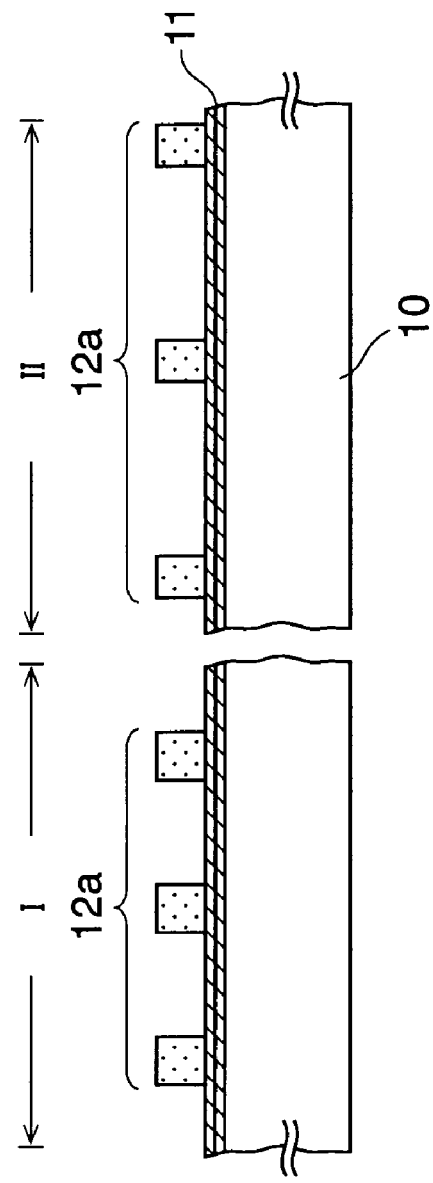

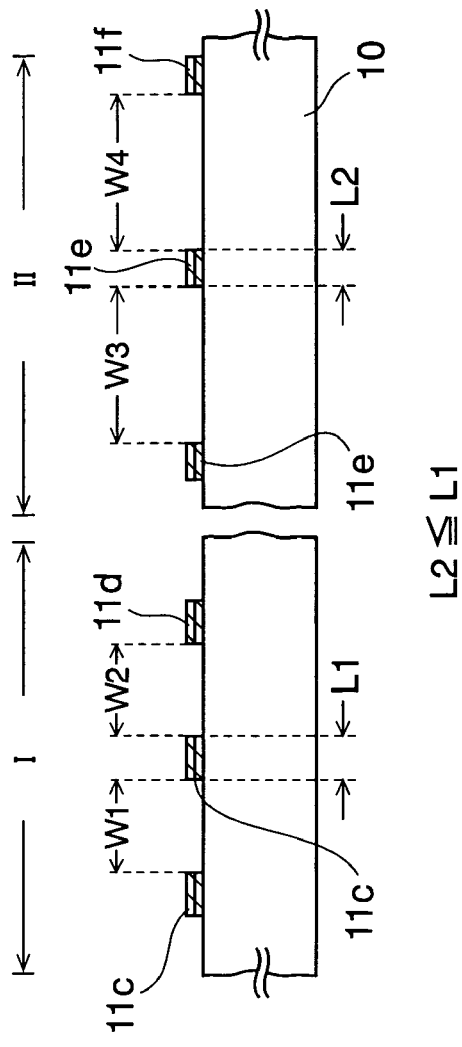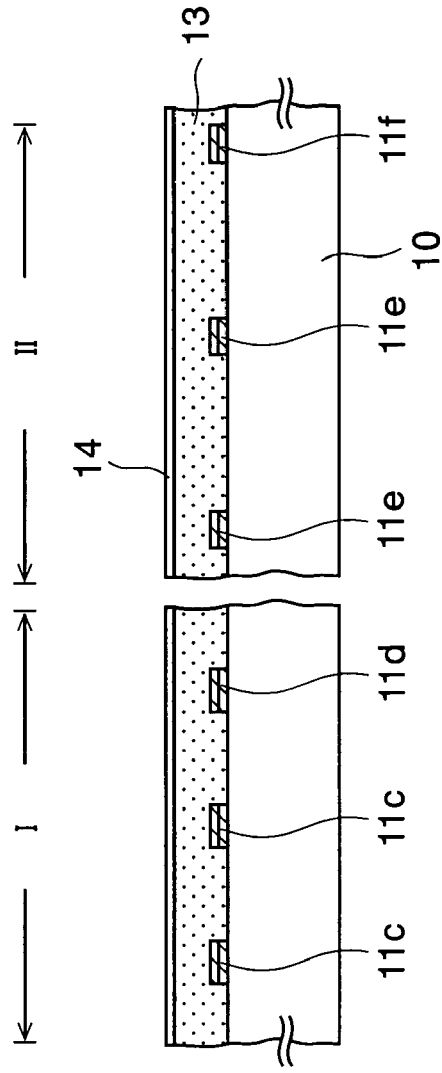

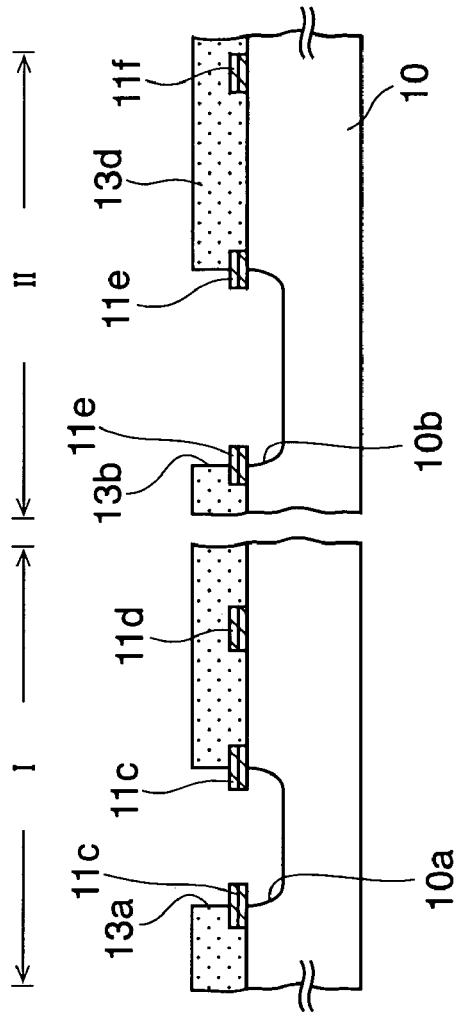
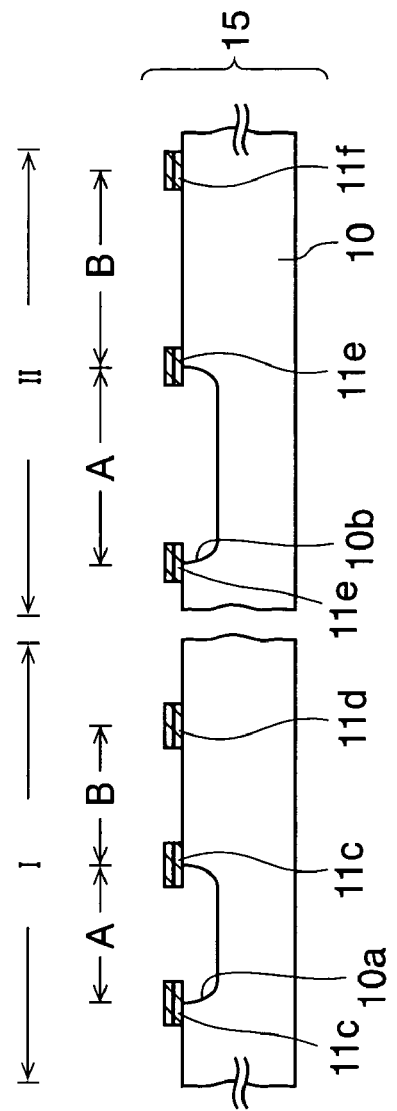

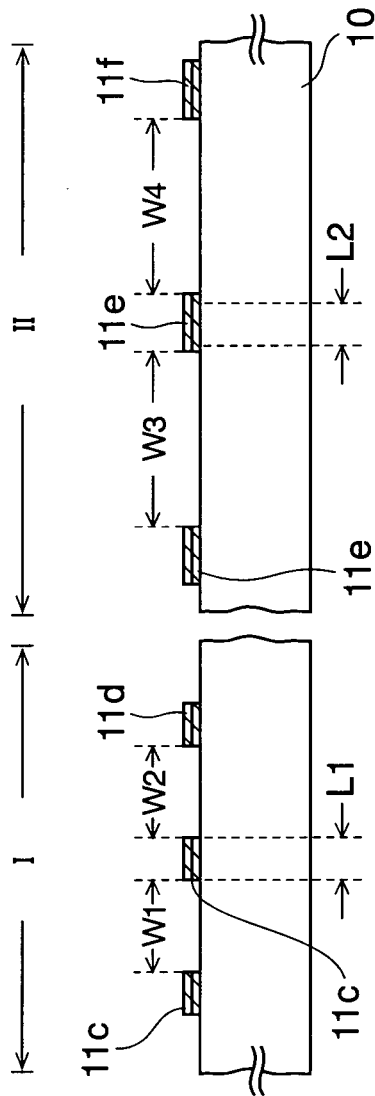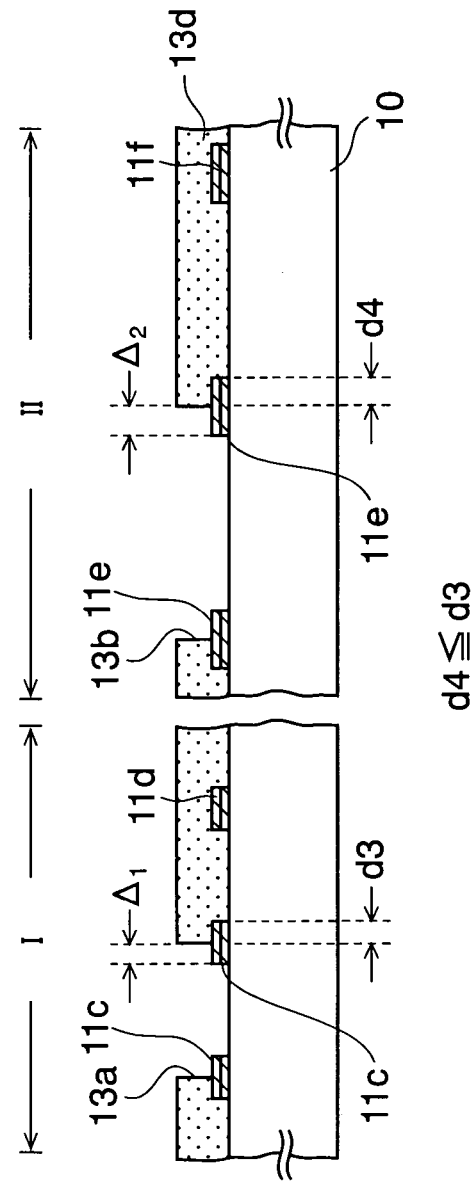
FIG. 6A
FIG. 6B

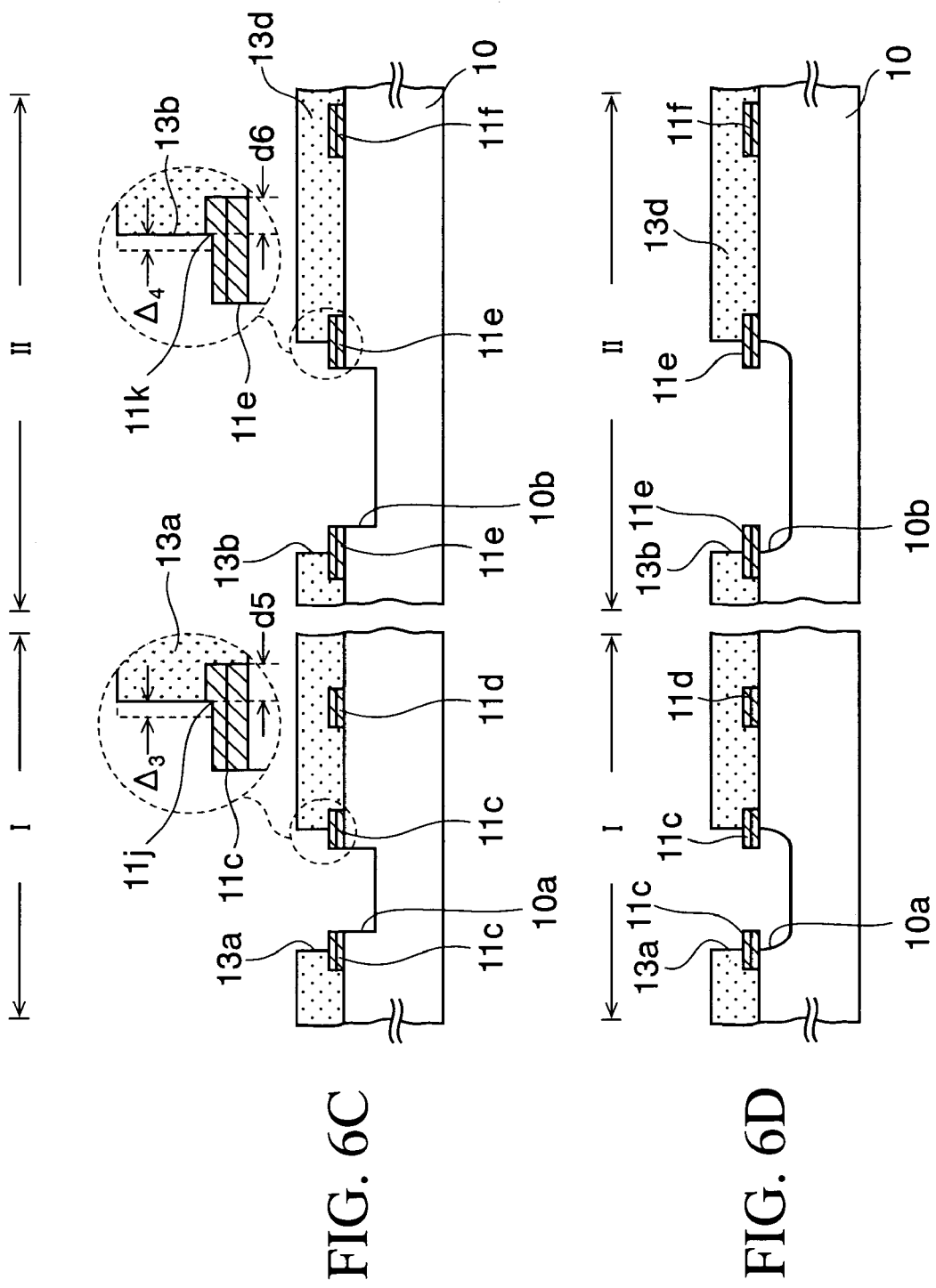

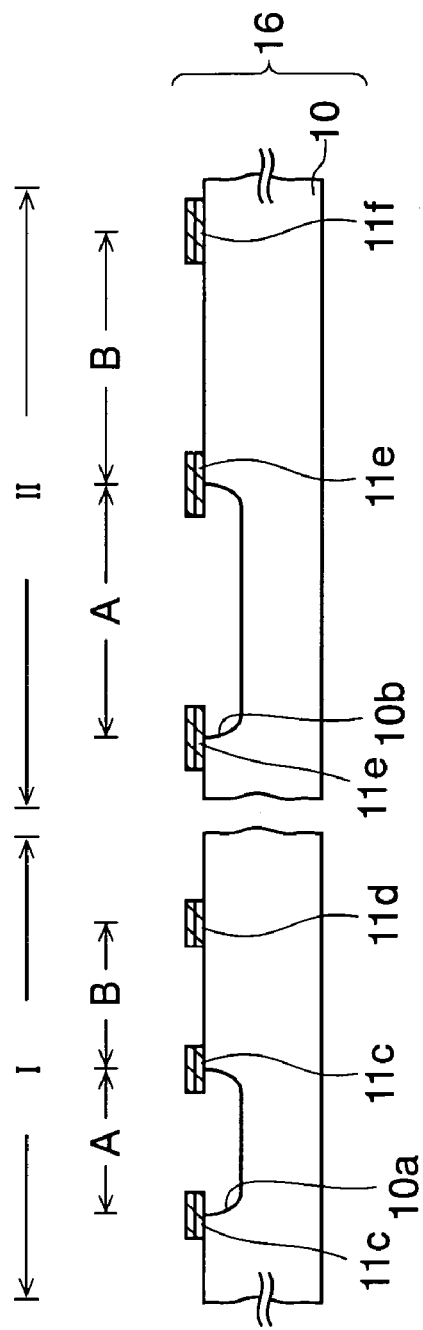

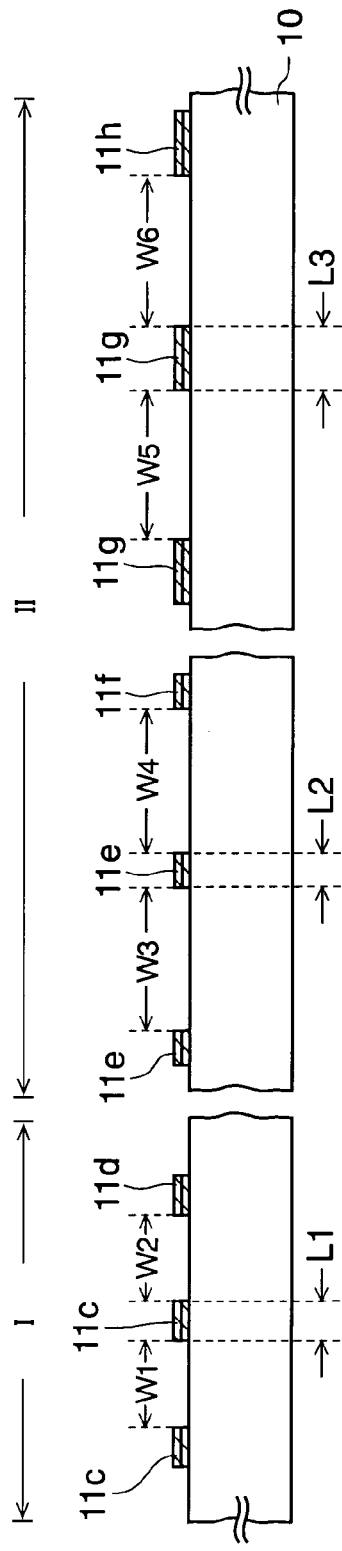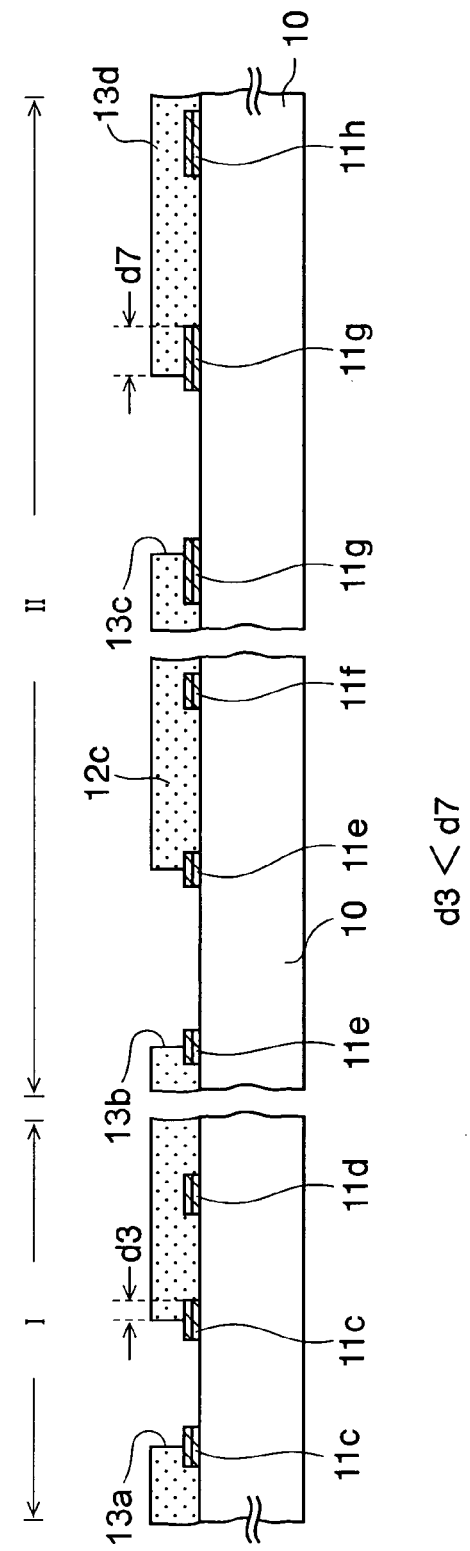

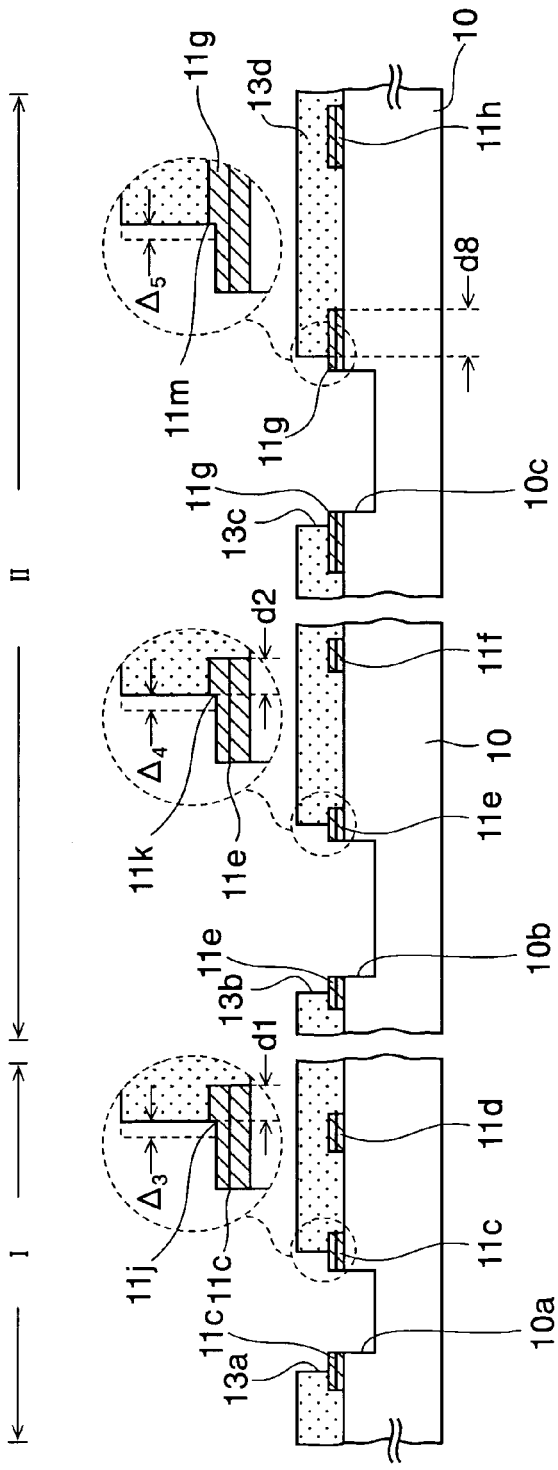
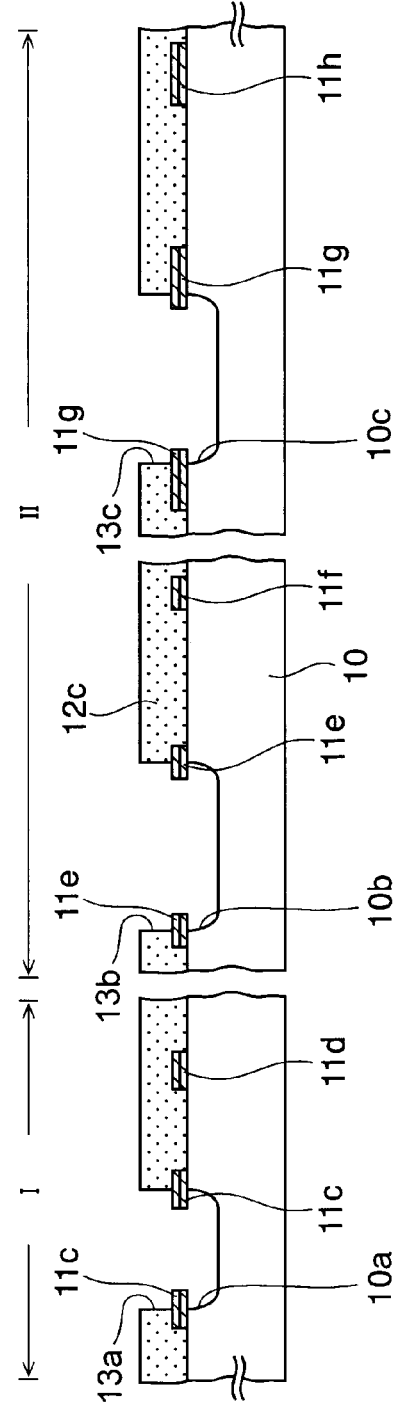
FIG. 9C
FIG. 9D

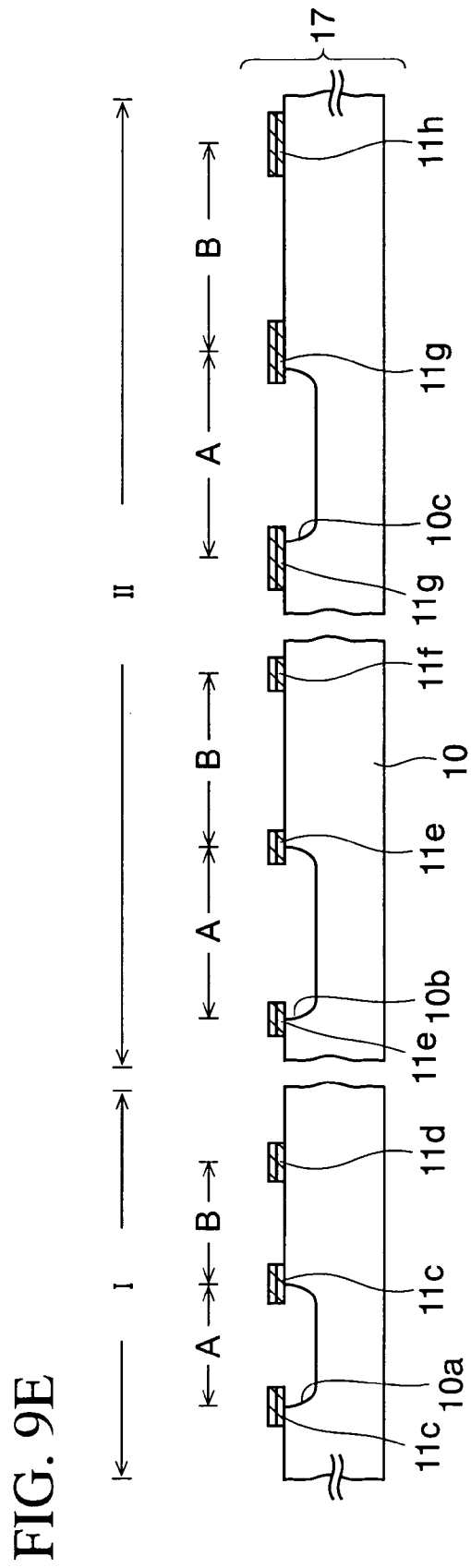

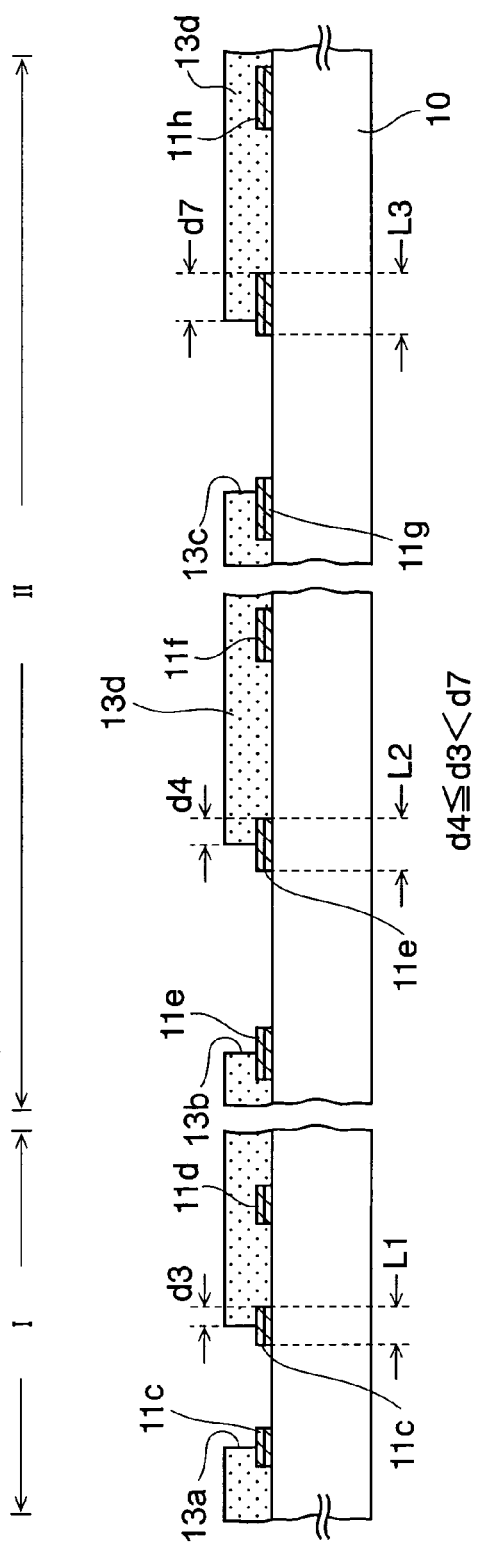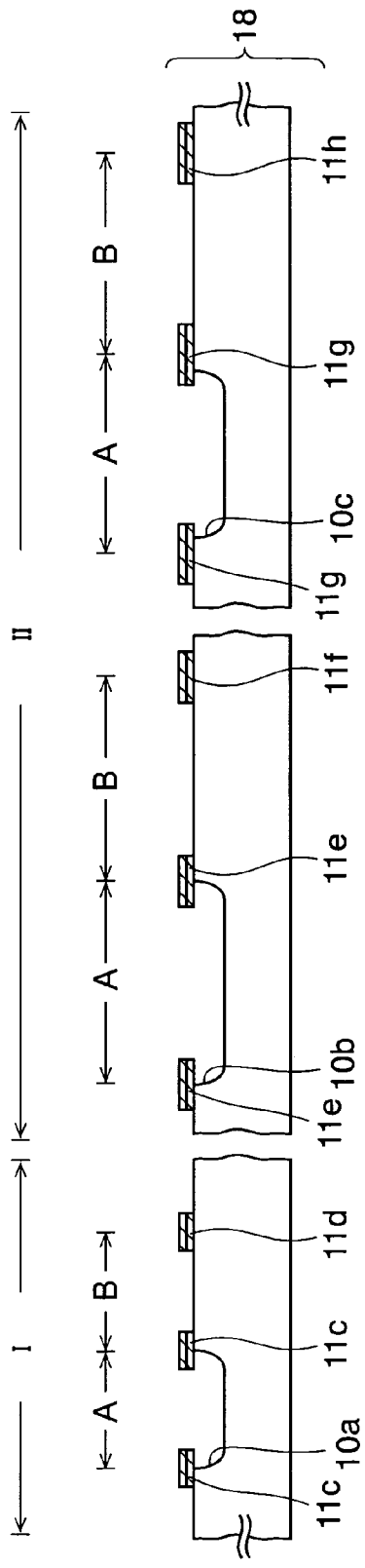

MASK FOR EXPOSURE AND METHOD OF MANUFACTURING THE SAME

CROSS-REFERENCE TO RELATED APPLICATIONS

This application is based on and claims priority of Japanese Patent Application No. 2004-266816 filed on Sep. 14, 2004, the entire contents of which are incorporated herein by reference.

BACKGROUND OF THE INVENTION

1. Field of the Invention

The present invention relates to a mask for exposure, and a method of manufacturing the mask.

2. Description of the Related Art

In recent years, semiconductor devices such as an LSI have increasingly become further microfabrication, and the minimum size of a device pattern has reached as narrow as 90 nm. To realize such microfabrication, it is necessary to improve the resolution of an exposure system used in photolithographic process, and research of super resolution technology using a phase shift mask has been actively done. In a pioneering example of the phase shift mask, a $\lambda/2$ plate for shifting a phase is provided on a light transmission portion between light-shielding patterns, as disclosed in Patent Document 1.

FIG. 1 is a sectional view of a digging Levenson mask that is a type of the phase shift mask.

In a Levenson mask 3 of a conventional example, first and second light-shielding patterns (2a, 2b) are formed on a transparent substrate 1 with a gap, and a concave portion 1a where a side surface recedes from the first light-shielding pattern 2a is formed on the transparent substrate 1 of shifter portion A. By making the side surface recede (go backward) in this manner, the width for exposure light made incident obliquely with respect to the transparent substrate 1 widens, and bouncing of exposure light by the side surface (shown in a dotted line) of the concave portion 1a.

In the Levenson mask 3, the depth of the concave portion 1a is determined such that a phase difference between exposure light having passed through the concave portion 1a and exposure light having passed through the transparent substrate 1, which is non-shifter portion B with no concave portion 1a, shifts by 180 degrees even. Consequently, exposure lights having passed through the transparent substrate 1 interfere to offset with each other on a light path near the boundary of shifter portion A and non-shifter portion B, contrast in this area is improved, and exposure pattern of high resolution can be transferred onto a wafer.

However, to realize it, the phase difference between the above-described exposure lights must be confirmed to be actually 180 degrees when manufacturing the mask 3.

From this viewpoint, Patent Document 2 discloses that patterns for evaluating phase difference, by which the phase difference is measured, are provided in addition to patterns for device, by which patterns for device are projected, an optical phase difference measurement system confirms that the phase difference of the patterns for evaluating phase difference is 180 degrees, and the phase difference of the patterns for device is thus guaranteed.

[Patent Document 1] Japanese Patent Laid-open No. 62-50811 publication (Kokoku publication)

[Patent Document 2] Japanese Patent Laid-open No. 9-258427 publication

However, since the patterns for evaluating phase difference are formed in a design rule same as that of the patterns for device in the method of Patent Document 2, luminous flux generated by the phase difference measurement system is bounced by the patterns for evaluating phase difference when the design rule is fine, and accurate measurement of phase difference becomes difficult.

SUMMARY OF THE INVENTION

According to one aspect of the present invention, there is provided a mask for exposure, comprising: a transparent substrate having a first concave portion in a device region and a second concave portion in a monitor region; two first light-shielding device patterns, which are formed on said transparent substrate in said device region at a first gap and severally extend from the both sides of said first concave portion over the first concave portion; a second light-shielding device pattern, which is formed on a flat surface of said transparent substrate in said device region at a second gap from said first light-shielding device pattern; two first light-shielding monitor patterns, which are formed on said transparent substrate in said monitor region at a third gap wider than said first gap and severally extend from the both sides of said second concave portion over the second concave portion; and a second light-shielding monitor pattern, which is formed on a flat surface of said transparent substrate in said monitor region at a fourth gap wider than said second gap from said first light-shielding monitor pattern, wherein a size of said first light-shielding monitor pattern is equal to or less than a size of said first light-shielding device pattern.

According to another aspect of the present invention, there is provided a mask for exposure, comprising: a transparent substrate having a first concave portion in a device region and a second concave portion in a monitor region; two first light-shielding device patterns, which are formed on said transparent substrate in said device region at a first gap and severally extend from the both sides of said first concave portion over the first concave portion; a second light-shielding device pattern, which is formed on a flat surface of said transparent substrate in said device region at a second gap from said first light-shielding device pattern; two first light-shielding monitor patterns, which are formed on said transparent substrate in said monitor region at a third gap wider than said first gap and severally extend from the both sides of said second concave portion over the second concave portion; and a second light-shielding monitor pattern, which is formed on a flat surface of said transparent substrate in said monitor region at a fourth gap wider than said second gap from said first light-shielding monitor pattern, wherein a step is formed on the top surface of said first light-shielding device pattern, which has a first distance from an end surface of said first light-shielding device pattern closer to said second light-shielding device pattern, and the height of the top surface of said first light-shielding device pattern on a portion extending from the step over said first concave portion is made lower than a height of a portion of said first light-shielding device pattern closer to said end surface, and a step is formed on the top surface of said first light-shielding monitor pattern, which has a second distance shorter than said first distance from an end surface of said first light-shielding monitor pattern closer to said second light-shielding monitor pattern, and the height of the top surface of said first light-shielding monitor pattern on a portion extending from the step over said second concave portion is made lower than a height of a portion of said first light-shielding monitor pattern closer to said end surface.

According to another aspect of the present invention, there is provided a method of manufacturing a mask for exposure, comprising the steps of: forming a light-shielding film on a transparent substrate; patterning said light-shielding film to form, in the device region of said transparent substrate, two first light-shielding device patterns at a first gap and a second light-shielding device pattern at a second gap from the first light-shielding device pattern, and to form, in the monitor region of said transparent substrate, two first light-shielding monitor patterns, which have a third gap wider than said first gap and have a size equal to or less than a size of said first light-shielding device pattern, and a second light-shielding monitor pattern at a fourth gap wider than said second gap from the first light-shielding monitor pattern; forming a resist pattern that covers said second light-shielding device pattern and said second light-shielding monitor pattern and has a first window where a part of the top surface of said two first light-shielding device patterns is exposed and a second window where a part of the top surface of said two first light-shielding monitor patterns is exposed; etching said transparent substrate through said first and second windows to form a first concave portion on said transparent substrate between said two first light-shielding device patterns and to form a second concave portion on said transparent substrate between said two first light-shielding monitor patterns; performing wet etching to said transparent substrate through said first and second windows to expand the width of said first and second concave portions, and thus to extend said first light-shielding device patterns over said first concave portion and to extend said first light-shielding monitor patterns over said second concave portion; removing said resist pattern; and allowing light pass through said second concave portion between said two first light-shielding monitor patterns and through the transparent substrate between said first light-shielding monitor pattern and said second light-shielding monitor pattern to measure the phase difference of transmitted light between said second concave portion and said substrate as a first phase difference, and then confirming whether or not the first phase difference is 180 degrees.

According to the present invention, since the pattern gap in the monitor region is wider than the pattern gap in the device region, the luminous flux from an optical phase difference measurement system is hard to be bounced by the first and the second light-shielding monitor patterns, and the measurement accuracy of phase difference improves.

Further, since the size of the first light-shielding monitor patterns is less than or equal to the size of the first light-shielding monitor patterns, an overlap amount between the resist pattern and the first light-shielding monitor patterns becomes equal to or less than the overlap amount between the resist pattern and the first light-shielding device patterns. Therefore, when the above-described overlap amount becomes insufficient because of positional shift of the resist pattern or receding (going-backward) of a side surface of the resist pattern in etching the first and second concave portions, infiltration of etchant used for expanding the first and second concave portions causes erosion of the transparent substrate of the non-shifter portion on both of the device region and the monitor region. Therefore, since the device region and the monitor region have the same phase shift amount by such erosion, the phase difference of the device region can be guaranteed with good accuracy by measuring the first phase difference in the monitor region.

According to still another aspect of the present invention, there is provided a method of manufacturing a mask for exposure, comprising the steps of: forming a light-shielding film on a transparent substrate; patterning said light-shielding film to form, in the device region of said transparent substrate, two first light-shielding device patterns at a first gap and a second light-shielding device pattern at a second gap from the first light-shielding device pattern, and to form, in the monitor region of said transparent substrate, two first light-shielding monitor patterns at a third gap wider than said first gap and a second light-shielding monitor pattern at a fourth gap wider than said second gap from the first light-shielding monitor pattern; forming a resist pattern that covers said second light-shielding device pattern and said second light-shielding monitor pattern and has a first window where top surfaces of said two first light-shielding device patterns are exposed and a second window where top surfaces of said two first light-shielding monitor patterns are exposed, and that overlaps said first light-shielding device pattern with a first overlap amount and overlaps said first light-shielding monitor pattern with a second overlap amount smaller than said first overlap amount; etching said transparent substrate through said first and second windows to form a first concave portion on said transparent substrate between said two first light-shielding device patterns and to form a second concave portion on said transparent substrate between said two first light-shielding monitor patterns; performing wet etching to said transparent substrate through said first and second windows to expand the width of said first and second concave portions and thus to extend said first light-shielding device patterns over said first concave portion and to extend said first light-shielding monitor patterns over said second concave portion; removing said resist pattern; and allowing light pass through said second concave portion between said two first light-shielding monitor patterns and through the transparent substrate between said first light-shielding monitor pattern and said second light-shielding monitor pattern to measure the phase difference of transmitted light between said second concave portion and said substrate as a first phase difference and then confirming whether or not the first phase difference is 180 degrees.

According to the present invention, the resist pattern is formed so as to overlap the first light-shielding device patterns with the first overlap amount and overlap the first light-shielding monitor patterns with the second overlap amount smaller than the first overlap amount. According to this method, since the second overlap amount is also reduced when the first overlap amount is reduced by the positional shift or the receding (going-backward) of side surface of the resist pattern, infiltration of etchant used for expanding the first and second concave portions causes erosion of the transparent substrate of the non-shifter portion on both of the device region and the monitor region. Therefore, the device region and the monitor region have the same phase shift amount due to erosion, and thus the phase difference of the device region can be guaranteed with good accuracy by measuring the first phase difference of the monitor region.

Further, a third light-shielding monitor pattern at a fifth gap wider than the first gap and a fourth light-shielding monitor pattern at a sixth gap wider than the second gap from the third light-shielding monitor pattern may be formed in the monitor region, and a third concave portion may be formed on the transparent substrate between the two third light-shielding monitor patterns. In such a case, it is preferable that the overlap amount between the third light-shielding monitor pattern and the resist pattern be larger than the overlap amount between the first light-shielding device pattern and the resist pattern, in the above-described step of forming the resist pattern.

According to this, the above-described erosion is difficult to occur on the transparent substrate beside the third light-shielding monitor pattern due to the large overlap amount between the third light-shielding monitor pattern and the resist pattern. Therefore, by measuring the phase difference between the third concave portion between the two third light-shielding monitor patterns and the transparent substrate between the third light-shielding monitor pattern and the fourth light-shielding monitor pattern as a second phase difference, it can be determined whether the erosion is caused on the transparent substrate, depending on the second phase difference and the first phase difference is the same or not.

BRIEF DESCRIPTION OF THE DRAWINGS

FIGS. 2A to 2I are in-process sectional views of a mask for exposure according to a first embodiment of the present invention;

FIGS. 6A to 6F are in-process sectional views of a mask for exposure according to a second embodiment of the present invention;

FIGS. 9A to 9E are in-process sectional views of a mask for exposure according to a third embodiment of the present invention;

FIGS. 12A and 12B are in-process sectional views of a mask for exposure according to a fourth embodiment of the present invention.

DETAILED DESCRIPTION OF THE PREFERRED EMBODIMENTS

Figure 1:
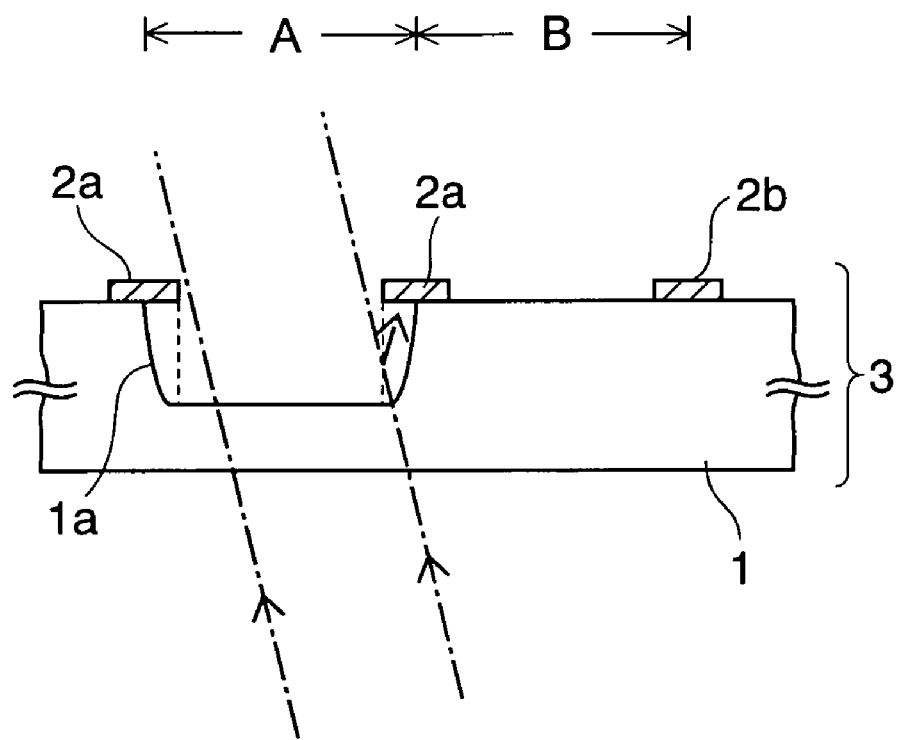
FIG. 1 is sectional views of a digging Levenson mask according to a conventional example.

Best modes for implementing the present invention will be explained. In each of the following embodiments, Levenson mask of the digging type will be fabricated.

(1) First Embodiment

FIGS. 2A to 2I are the in-process sectional views of a mask for exposure according to a first embodiment of the present invention.

First of all, description will be made for process until the sectional structure shown in FIG. 2A will be obtained.

A quartz substrate (transparent substrate) 10, which has device region I where the light-shielding device patterns are formed and monitor region II where the phase difference of exposure light is measured, is brought into a sputtering chamber (not shown) first. The device region I is a region for obtaining an exposure pattern that is used when patterning metal wirings, gate electrodes, holes of an insulating film, or the like.

Further, although the size of the quartz substrate 10 is not particularly limited, a substrate having the side size of 6 inches and the thickness of 0.25 inch is employed in this embodiment. Then, with a sputtering method using Ar (argon) gas, a Cr (chromium) layer 11a is formed on the quartz substrate 10 in the thickness of about 70 nm.

Subsequently, $O_2$ (oxygen) is introduced into the sputtering chamber to sputter Cr target by $Ar+O_2$. Accordingly, oxygen reacts with Cr in a phase and a chromium oxide layer 11b is thus formed on the chromium layer 11b in the thickness of about 30 nm. Such a sputtering method is called a reactive sputtering method.

Consequently, a light-shielding film 11 having the thickness of about 100 nm, which is made up of the chromium layer 11a and the chromium oxide layer 11b, is formed. The chromium oxide layer 11b that constitutes the light-shielding film 11 functions as an anti-reflection film that prevents the reflection of exposure light when a mask for exposure to be finally completed is used in an exposure system.

They layer structure of the light-shielding film 11 is not limited to this. For example, the chromium oxide layer may be formed as an adhered layer between the quartz substrate 10 and the chromium layer 11a by the reactive sputtering method.

Then, a first positive electron beam photoresist 12 is formed on the light-shielding film 11 by a spin coating method in the thickness of about 400 nm.

Note that the combination of the quartz substrate 10 and the light-shielding film 11 is called blanks, and the blanks on which the first photoresist 12 is formed may be purchased from blanks manufacturer and perform the following process may be performed.

Figure 4A:
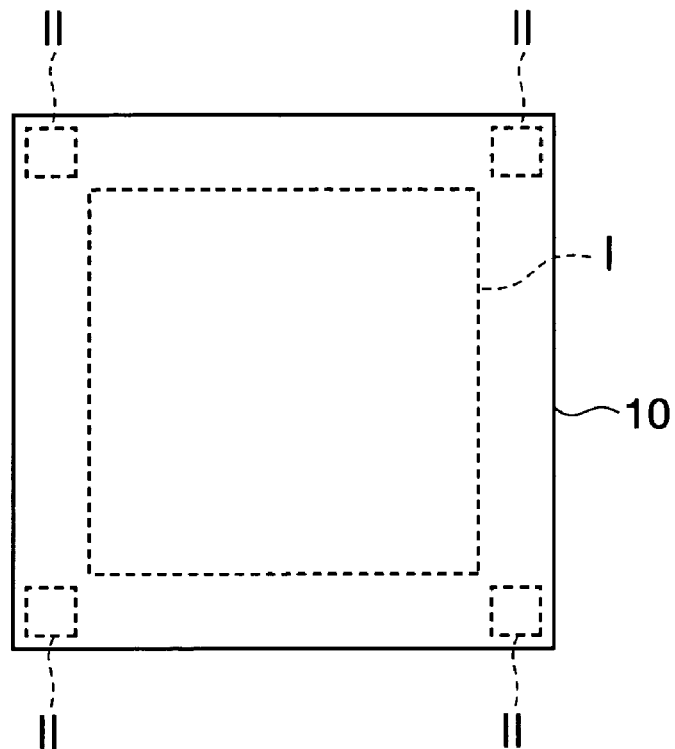
FIGS. 4A and 4B are plan views showing the arrangement of the device region I and the monitor region II in the mask for exposure according to the first embodiment of the present invention.
Figure 4B:
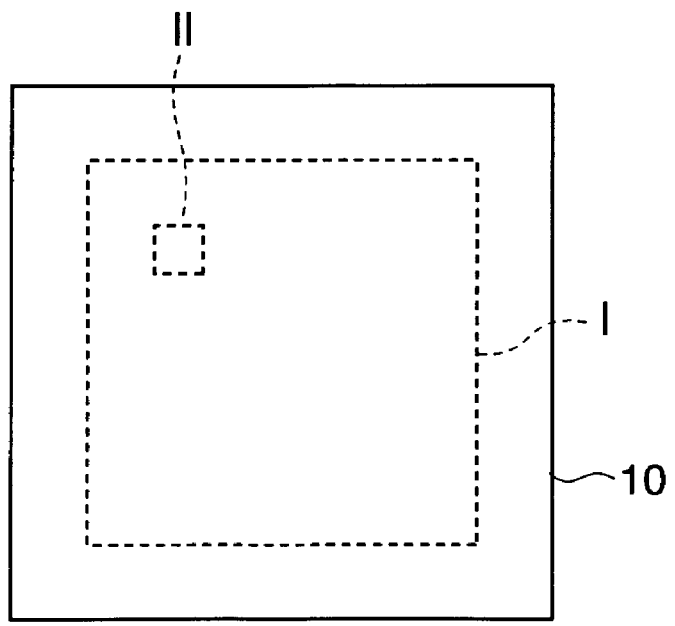

Furthermore, the method of arranging the device region I and the monitor region II is not particularly limited. For example, as shown in FIG. 4A, the monitor regions II may be arranged on four corners of the quartz substrate 10 to prevent the light-shielding patterns formed in the monitor regions II from being transferred onto a wafer. Alternatively, in the case where the transfer of the light-shielding patterns is not a problem, the monitor regions II may be arranged in the device region I as shown in FIG. 4B Subsequently, as shown in FIG. 2B, the first photoresist 12 is exposed using an EB (Electron Beam) exposure apparatus, and it is developed to form the first resist patterns 12a on the light-shielding film 11.

Next, description will be made for process until the sectional structure shown in FIG. 2C will be obtained.

Dry etching is performed to the light-shielding film 11 by an ICP (Inductively Coupled Plasma) etching system (not shown) while using the first resist patterns 12a as a mask.

Consequently, at least two first light-shielding device patterns 11c are formed in the device region I of the quartz substrate 10 at first gap (interval) W1, and a second light-shielding device pattern 11d is formed at second gap W2 from the first light-shielding device pattern 11c.

Similarly, two first light-shielding monitor patterns 11e are formed in the monitor region II of the quartz substrate 10 at third gap W3, and a second light-shielding monitor pattern 11f is formed at fourth gap W4 from the first light-shielding monitor pattern 11e.

Out of the first to fourth gaps W1 to W4, a value corresponding to the design rule of a device is employed as the pattern gaps (W1, W2) in the device region I, and W1=W2=0.56 µm, for example, is used in this embodiment.

On the contrary, in the monitor region II, a bouncing amount of luminous flux caused by the first and second monitor patterns (11e, 11f) needs to be minimized when the luminous flux from the optical phase difference measurement system is allowed to pass through the region later. Therefore, W1<W3 and W2<W4 are used to make the gaps (W3, W4) in the monitor region larger than the gaps (W1, W2) in the device region. It is preferable that each gap (W3, W4) be 2 to 5 µm, and it is 3.76 µm in this embodiment.

Moreover, regarding the size of each pattern (11c to 11f), a size L1 of the first light-shielding device pattern 11c is set to L1=0.24 µm corresponding to the design rule of the device.

On the other hand, a value equal to or smaller than the above-described size L1 of the first light-shielding device pattern 11c is employed as a size L2 of the first light-shielding monitor pattern 11e in the monitor region II, and 0.24 µm equal to L1 is employed in this embodiment.

After this process, ashing is performed to remove the first resist patterns 12a by oxygen plasma, and the substrate 10 is cleaned by wet treatment.

Next, as shown in FIG. 2D, a second positive electron beam photoresist 13 is formed on the quartz substrate 10 and on each light-shielding pattern (11c to 11f) in the thickness of about 400 nm by the spin coating method, an anti-static material such as aquaSAVE (manufactured by Mitsubishi Rayon Co., Ltd.) is additionally coated on the photoresist by the spin coating method, and thus an anti-static layer 14 having the thickness of about 100 nm is formed.

Figure 2E:
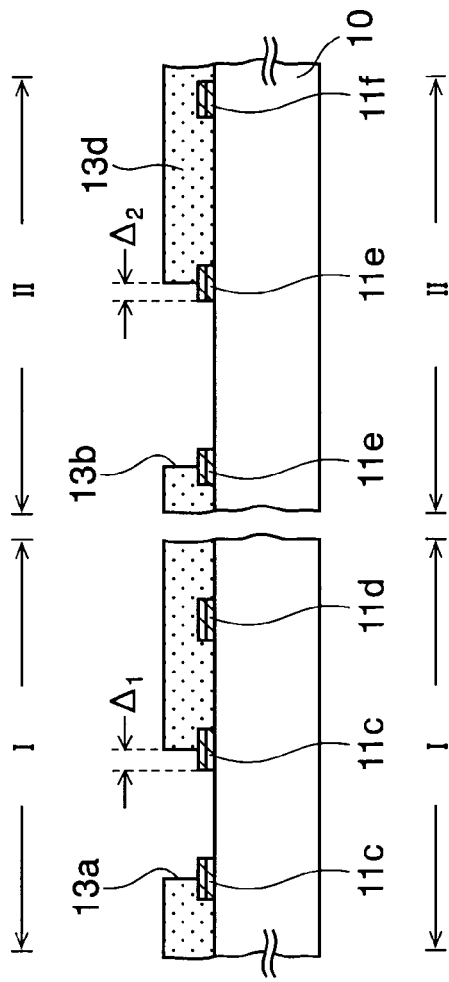

Subsequently, as shown in FIG. 2E, the second photoresist 13 is exposed using the EB exposure apparatus, and it is developed to form a second resist pattern 13d.

The second resist pattern 13d covers the second light-shielding device pattern 11d and the second light-shielding monitor pattern 11f. Then, a first and a second windows (13a, 13b) are formed on the second resist pattern 13d of regions where concave portions for shifter will be formed later.

However, the concave portions for shifter are formed in a self-aligned manner with the first light-shielding device pattern 11c and the first light-shielding monitor pattern 11e in the next etching process, the width of the concave portions for shifter becomes narrower than expected when the patterns (11c, 11e) are completely covered by the second resist pattern 13d, and their processing accuracy is reduced.

For this reason, in this embodiment, the side surface of the first window 13a recedes from the side surface of the first light-shielding device pattern 11c by $\Delta_1$=50 nm to expose a part of the top surface of the first light-shielding device pattern 11c from the first window 13a. Similarly, the side surface of the second window 13b recedes from the side surface of the first light-shielding monitor pattern 11e by $\Delta_2$=50 nm to expose a part of the top surface of the first light-shielding monitor pattern 11e from the second window 13b.

Accordingly, even if each light-shielding pattern (11c to 11f) and the second resist pattern 13d are misaligned a little, the first light-shielding device pattern 11c and the first light-shielding monitor pattern 11e are not completely covered by the second resist pattern 13d, so that the concave portions for shifter can be processed with good accuracy.

A method of allowing the side surface of each window (13a, 13b) to recede as described above is not particularly limited. For example, a receding (gone-backward) amount is added to exposure data of the EB exposure apparatus or an exposure dose when forming the windows (13a, 13b) is set to an overdosed value intentionally to make the windows (13a, 13b) wider, and the receding amount (gone-backward amount) ($\Delta_1$, $\Delta_2$) may be obtained.

Figure 2F:
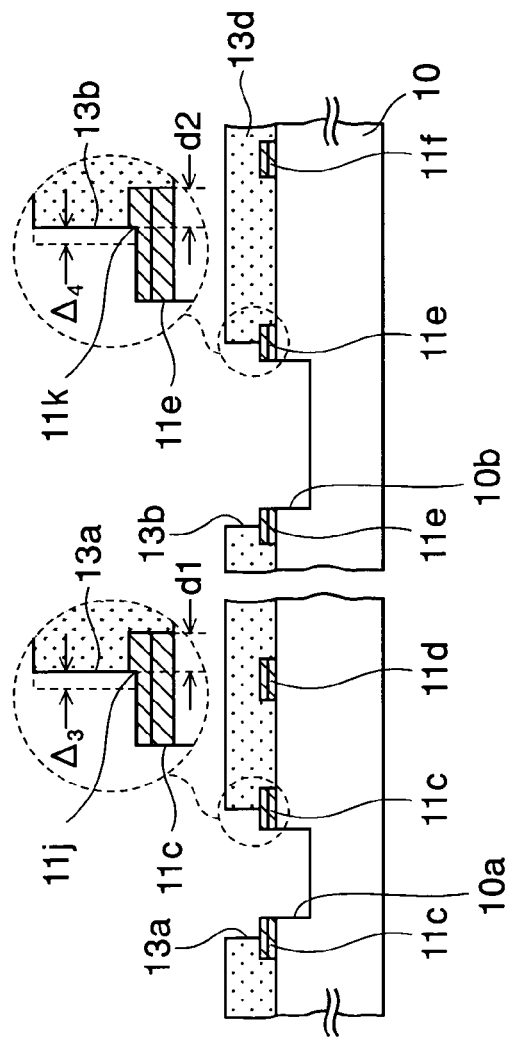

Next, as shown in FIG. 2F, dry etching is performed to the quartz substrate 10 through the first and second windows (13a, 13b) by RIE (Reactive Ion Etching) using $CF_4$ gas as etching gas, and first and second concave portions for shifter (10a, 10b) having the depth of about 70 nm are formed on the quartz substrate 10. As the conditions for such etching, flow rate of $CF_4$ gas: 100 sccm, frequency of radio frequency electric power: 13.56 MHz, power of radio frequency electric power: 200 W, pressure: 6 Pa, and etching time: 240 seconds are employed.

Meanwhile, in this etching, the quartz substrate 10 is etched approximately vertically by plasma that moves in a vertical direction to the primary surface of the quartz substrate 10. However, some plasma has kinetic component in a parallel direction to the primary surface of the quartz substrate 10, the side surface of each window (13a, 13b) suffers damage by such plasma and the surfaces recede by ($\Delta_3$, $\Delta_4$). Although the receding (gone-backward) amount ($\Delta_3$, $\Delta_4$) is different depending on etching conditions, it is typically about 20 nm.

Furthermore, in this etching, the top surface of the first light-shielding device pattern 11c and the first light-shielding monitor pattern 11e, which are partially exposed from the first and second windows (13a, 13b), are etched by a small amount, in addition to the quartz substrate 10.

As a result, as shown in a dotted circle in the device region I of FIG. 2F, a step 11j is formed on the top surface of the first light-shielding device pattern 11c, which has a first distance d1 from the end surface of the first light-shielding device pattern 11c closer to the second light-shielding device pattern 11d. The distance d1 is L1−$\Delta_1$−$\Delta_3$ when no positional shift of the second resist pattern 13d occurred. Then the height of the top surface of the first light-shielding device pattern 11c of the area extending from the step 11j to the first concave portion 10a becomes lower than the area closer to the second light-shielding device pattern 11d.

In the similar manner, as shown in a dotted circle in the monitor region II, a step 11k is formed on the top surface of the first light-shielding monitor pattern 11e, which has a second distance d2 from the end surface of the first light-shielding monitor pattern 11e closer to the second light-shielding monitor pattern 11f, and the height of the top surface of the first light-shielding monitor pattern 11e of the area extending from the step 11k to the second concave portion 10b becomes lower.

The distance d2 is L2−$\Delta_2$−$\Delta_4$ when no positional shift of the second resist pattern 13d occurred. Then, as described above, the size L2 of the first light-shielding monitor pattern 11e is set to equal to or less than the size L1 of the first light-shielding device pattern 11c and $\Delta_1$=$\Delta_2$ and $\Delta_3$=$\Delta_4$ hold, so that the second distance d2 becomes a value equal to or less than the first distance d1 (=L1−ΔL−$\Delta_3$). In addition, even if the resist pattern 12c has overall positional shift, the positional shift amount is the same in the device region I and the monitor region II and the second distance d2 becomes equal to or less than the first distance d1 as well.

Next, as shown in FIG. 2G, buffer hydrofluoric acid is used as etchant to perform isotropic wet etching to the quartz substrate 10 through the first and second windows (13a, 13b), the width and the depth of the first and second concave portions (10a, 10b) are severally expanded by about 100 nm, and the depth of each concave portion (10a, 10b) is set to about 170 nm. As a result of such etching, a structure is obtained where the first light-shielding device patterns 11c extend from the both sides of the first concave portion 10a and the first light-shielding monitor patterns 11e extend from the both sides of the second concave portion 10b.

Then, as shown in FIG. 2H, the resist pattern 13d is removed by ashing with oxygen plasma and wet treatment, and the fundamental structure of a mask for exposure 15 according to this embodiment is completed.

The mask for exposure 15 has shifter portion A, which is constituted by the quartz substrate 10 of an area whose thickness has become thin due to the first and second concave portions (10a, 10b), and non-shifter portion B which is constituted by the quartz substrate 10 where the concave portions (10a, 10b) have not been formed and whose thickness has not been made thin.

Hereinafter, an inspection process starts where confirmation is made as to whether the phase difference of exposure lights passing through the shifter portion A and the non-shifter portion B in the device region I is actually 180 degrees.

In the inspection process, two luminous fluxes having a wavelength equal to that of the exposure light, which is expected to be used for the mask for exposure 15, are allowed to pass through the shifter portion A and the non-shifter portion B, and the phase difference of each luminous flux is measured by a light detection section. Since the diameter of the luminous flux is generally several µm, the gap of the light-shielding patterns (11c, 11d) in the device region I requires several µm as well. However, gap between the light-shielding patterns (11c, 11d) in the device region I is narrower with finer design rule, so that bouncing of luminous flux by the light-shielding patterns occurs. As a result, the intensity of luminous flux that the light detection section receives is reduced, an S/N ratio of signals output from the light detection section becomes small, and it becomes difficult to measure the phase difference with good accuracy.

Therefore, in this embodiment, the above-described phase difference is measured in the monitor region II where the pattern gap is wider than that of the device region I.

Figure 2I:
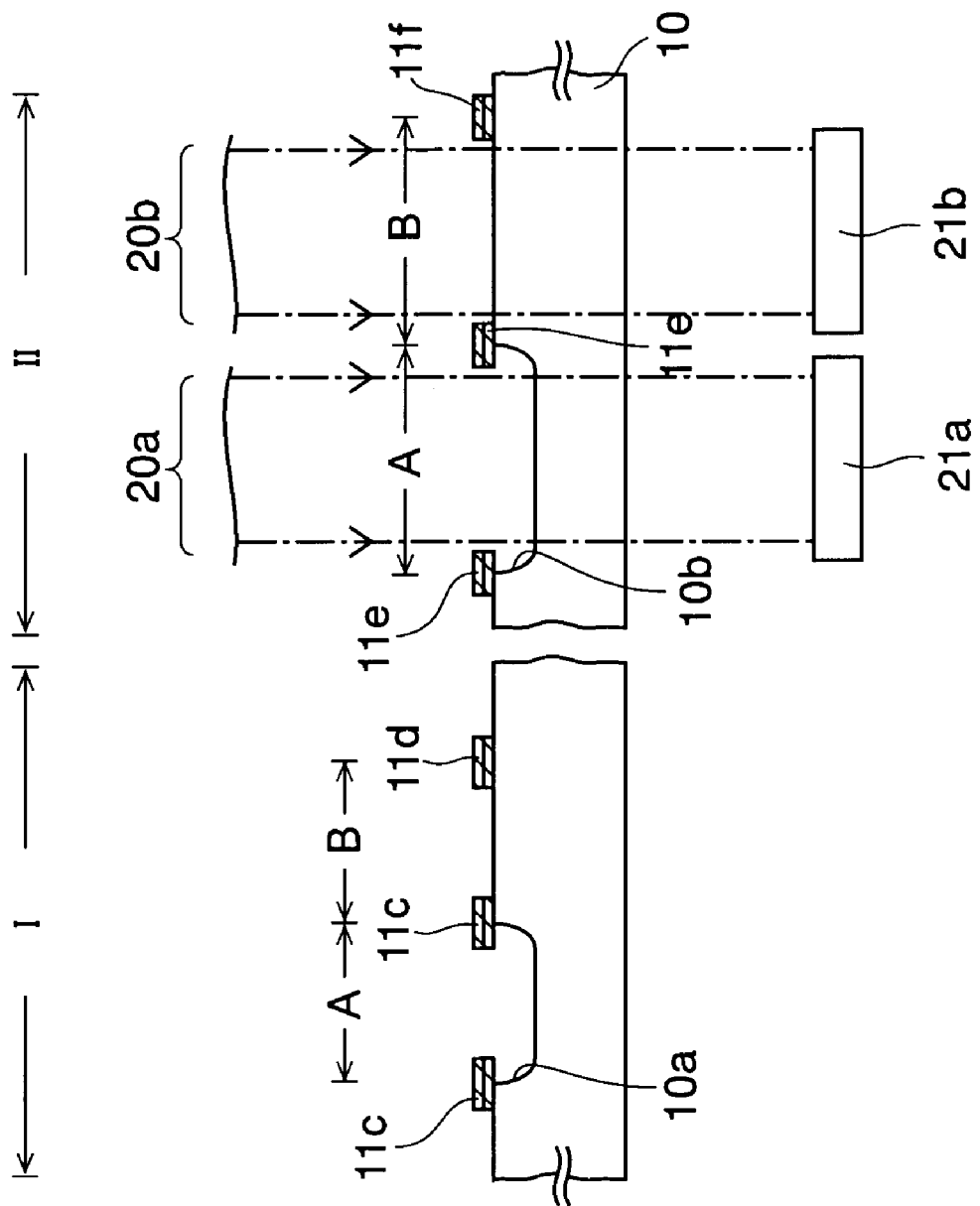

In the measurement, as shown in FIG. 2I, luminous fluxes (20a, 20b) from an ArF excimer laser having the wavelength of 193 nm that is equal to exposure wavelength are allowed to pass through the shifter portion A and the non-shifter portion B in the monitor region II, and light detection sections (21a, 21b) that are separately provided for each luminous flux (20a, 20b) measure the phase difference between the luminous flux (20a, 20b). Such measurement can be performed using the phase difference measurement system such as MPM248 manufactured by Lasertec Corporation, for example.

Then, when the phase difference obtained by the measurement is 180 degrees, the above-described process conditions are determined to be appropriate. On the other hand, when the phase difference is shifted from 180 degrees, etching amount of the first and second concave portions (10a, 10b) in FIG. 2E is determined to be too much or too little, and the etching conditions are changed.

Meanwhile, in the measurement of phase difference shown in FIG. 2I, since the phase difference in the monitor region II guarantees the phase difference in the device region I, which is supposed to be measured, it is assumed that the phase differences in the regions (I, II) be the same.

Figure 3:
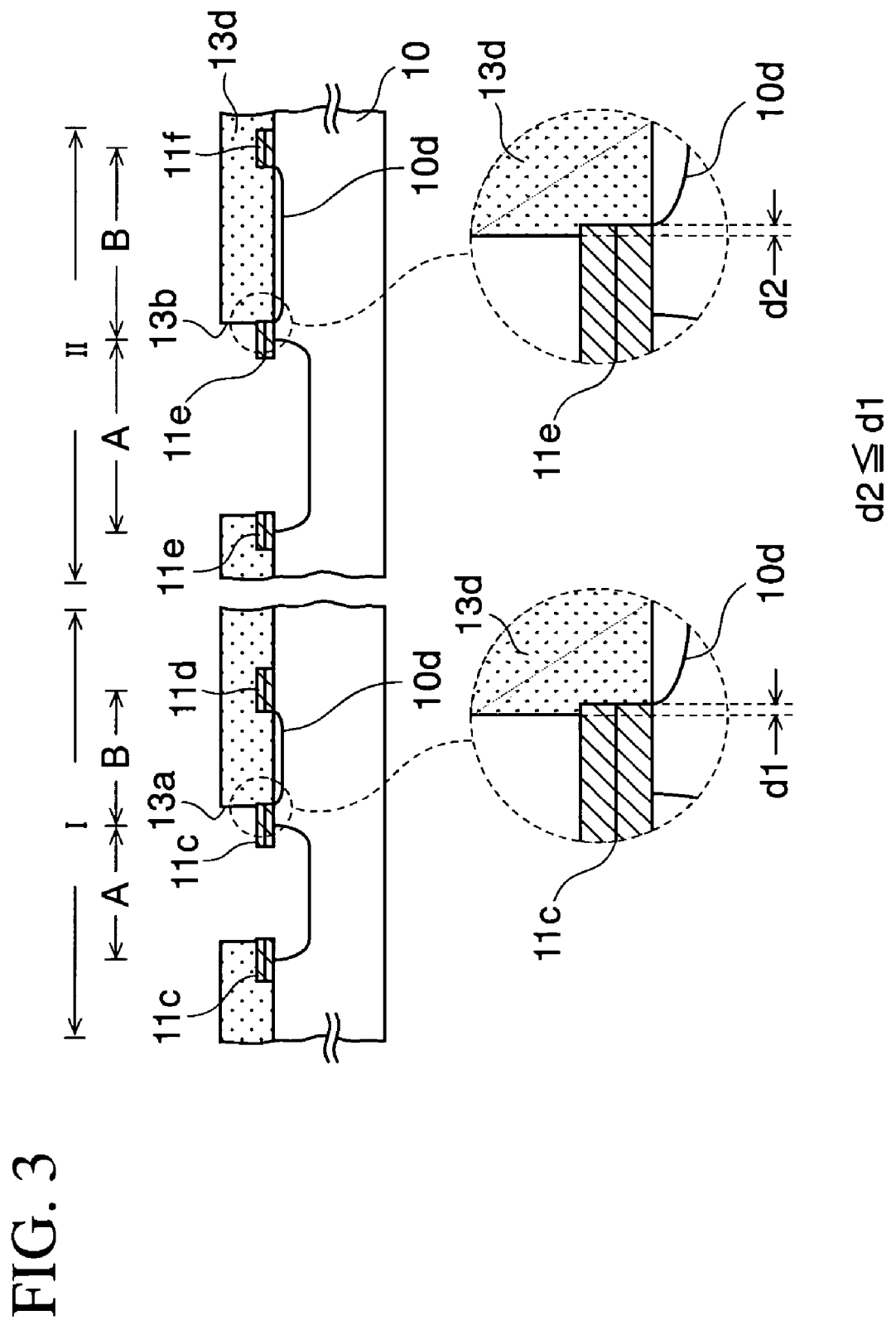
FIG. 3 is a sectional view showing that erosion occurs on a quartz substrate of both a device region I and a monitor region II in the mask for exposure according to the present invention.

The phase difference between the shifter portion A and the non-shifter portion B of the device region I is normally determined by the etching depth of the first concave portion 10a. However, there are cases where the first window 13a shifts toward the second light-shielding device pattern 11d due to the overall positional shift of the second resist pattern 13d, as shown in FIG. 3. Consequently, etchant for wet etching infiltrates from the side surface of the first window 13a into the quartz substrate 10 in the non-shifter portion B of the device region I when performing the wet etching to widen the width of the first and second concave portions (10a, 10b), which has been explained in FIG. 2G, and the quartz substrate 10 in the non-shifter portion B is etched and erosion 10d occurs as shown in FIG. 3. As a result, the phase difference between the shifter portion A and the non-shifter portion B of the device region I is shifted from 180 degrees even if the depth of the first concave portion 10a is appropriate. Such a phenomenon also occurs when the receding (gone-backward) amount ($\Delta_3$, $\Delta_4$) of the first window 13a in dry etching, which has been explained in FIG. 2F, is larger than expected, other than the positional shift of the second resist pattern 13d.

However, occurrence of such erosion 10d in the non-shifter portion B is not a problem when it can be discovered and measures such as correction of the positional shift of the second resist pattern 13d is taken.

In view of this, to find such phenomenon in the phase difference measurement step of FIG. 2I, present embodiment has employed a size equal to or less than the size L1 of the first light-shielding device pattern as the size L2 of the first light-shielding monitor pattern lie in the monitor region II, in the step explained in FIG. 2C. According to this, when the second resist pattern 13d has the overall positional shift and the overlap amount between the second resist pattern 13d and the first light-shielding device pattern 11c becomes d1 as shown in FIG. 3, the overlap amount d2 between the second resist pattern 13d and the first light-shielding monitor pattern 11e always becomes the value of d1 or less. Therefore, when the erosion 10d occurs in the non-shifter portion B of the device region I due to the insufficient overlap amount d1, the erosion 10d definitely occurs in the non-shifter portion B of the monitor region II where the overlap amount d2 is equal to or less than d1.

Consequently, the phase difference in the device region I and the phase difference in the monitor region II become the same value because of the erosion 10d that occurred in each region, so that the phase difference in the device region I can be guaranteed by the phase difference in the monitor region II with good accuracy.

Figure 5:
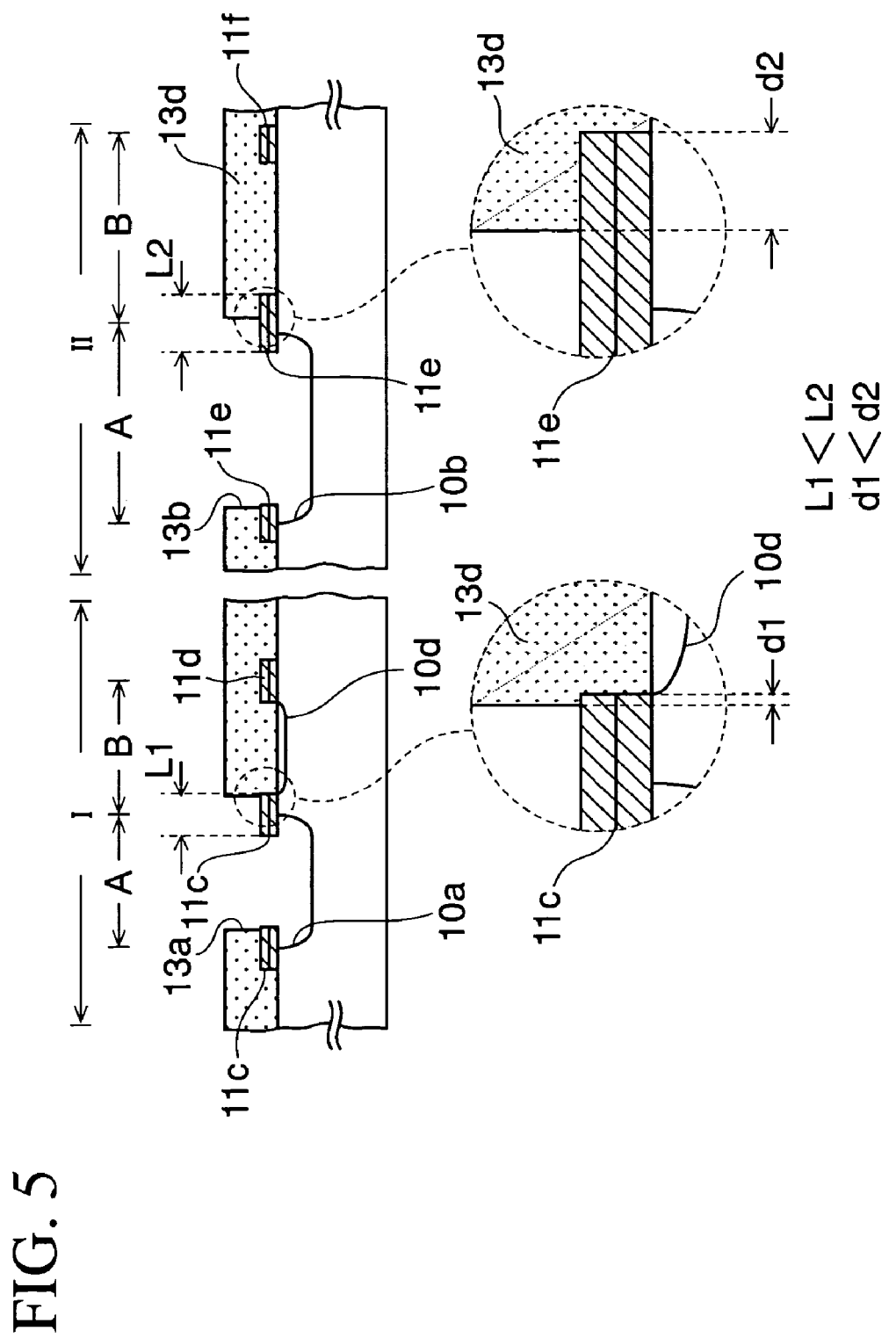
FIG. 5 is a sectional view of a mask for exposure of a comparative example.

FIG. 5, on the contrary to this embodiment described above, is the sectional view of a comparative example where the size L2 of the first light-shielding monitor pattern 11e is formed wider than the size L1 of the first light-shielding device pattern 11c.

In the comparative example, the erosion 10d also occurs in the non-shifter portion B of the device region I by the infiltration of etchant when the overlap amount d1 between the first light-shielding device pattern 11c and the second resist pattern 13d is insufficient. However, the size L2 of the first light-shielding monitor pattern 11e has been increased in the monitor region II, so that the overlap amount d2 between first light-shielding monitor pattern 11e and the second resist pattern 13d becomes larger than d1 in the device region I. As a result, the erosion 10d of the quartz substrate 10 is hard to occur in the non-shifter portion B of the monitor region II. Consequently, the phase differences of the device region I and the monitor region II become different due to with or without of the erosion 10d, and it becomes difficult to guarantee the phase difference of the device region I by that of the monitor region II.

(2) Second Embodiment

FIGS. 6A to 6F are the in-process sectional views of the mask for exposure according to the second embodiment of the present invention. In these drawings, reference numerals same as those of the first embodiment are attached to elements explained in the first embodiment, and their explanation will be omitted in the following.

In the first embodiment, the size L2 of the first light-shielding monitor pattern lie in the monitor region II was set to equal to or less than the size L1 of the first light-shielding device pattern 11c in the device region I or less, and the phase difference of the device region I was guaranteed by the phase difference of the monitor region II.

On the contrary, in this embodiment, the overlap amount between the resist pattern and the light-shielding pattern is set as follows in order to obtain advantages same as the first embodiment.

Firstly, by performing the process of FIGS. 2A to 2D explained in the first embodiment, light-shielding patterns (11c to 11f) are formed on the quartz substrate 10 as shown in FIG. 6A.

In this embodiment, it is possible to set the size L2 of the first light-shielding monitor pattern 11e regardless of the size L1 of the first light-shielding device pattern 11c, which are L2=2.0 μm and L1=0.24 μm, for example. Further, the gaps W1 to W4 between the light-shielding patterns (11c to 11f) are equal to those of the first embodiment, which are W1=W2=0.56 μm and W3=W4=3.76 μm.

Next, by performing the same process as FIG. 2E explained in the first embodiment, the second resist pattern 13d is formed on the light-shielding patterns (11c to 11f) as shown in FIG. 6B.

Note that, in the first embodiment, the same value was employed as the receding (gone-backward) amount ($\Delta_1$, $\Delta_2$) of the first and second windows (13a, 13b) of the second resist pattern 13d, but $\Delta_1$=50 nm and $\Delta_2$=1.81 μm, for example, are used in this embodiment. As a result, the overlap amount d4 between the second resist pattern 13d and the first light-shielding monitor pattern 11e becomes 0.19 μm (=2.0 μm−1.81 μm) that is equal to the overlap amount d3 (=0.24 μm−50 nm) in the first light-shielding device pattern 11c. It is to be noted that the present invention is not limited to this, and the receding (gone-backward) amount ($\Delta_1$, $\Delta_2$) may be larger than the above-described values, which is d4≦d3.

Then, by performing the process of FIG. 2F explained in the first embodiment, the first and second concave portions for shifter (10a, 10b) having the depth of about 70 nm are formed on the quartz substrate 10 by dry etching as shown in FIG. 6C.

In this dry etching, the side surfaces of the first and second windows (13a, 13b) recede by approximately the same value of ($\Delta_3$, $\Delta_4$) due to plasma having kinetic component in a parallel direction to the primary surface of the quartz substrate 10 in the same manner as the first embodiment, and the receding (gone-backward) amount ($\Delta_3$, $\Delta_4$) is typically about 20 nm. Thus, the overlap amount between the first light-shielding device pattern 11c and the second resist pattern 13d becomes d5 (=d3−$\Delta_3$) that is smaller than the original overlap amount of d3. Similarly, the overlap amount between the first light-shielding monitor pattern 11e and the second resist pattern 13d becomes d6 (=d4−$\Delta_4$) that is smaller than the original overlap amount of d4.

Furthermore, the step 11j is formed by the dry etching on the top surface of the first light-shielding device pattern 11c, which has the distance d5 from the end surface of the first light-shielding device pattern 11c closer to the second light-shielding device pattern 11d, and the height of the top surface of the first light-shielding device pattern 11c of the area extending from the step 11j to the first concave portion 10a becomes lower.

Similarly, the step 11k is formed on the top surface of the first light-shielding monitor pattern 11e, which has the distance d6 shorter than the distance d5 from the end surface of the first light-shielding monitor pattern 11e closer to the second light-shielding monitor pattern 11f, and the height of the top surface of the first light-shielding monitor pattern 11e of the area extending from the step 11k to the second concave portion 10b becomes lower.

Thereafter, by performing the process of FIG. 2G explained in the first embodiment, the side surfaces of the first and second concave portions (10a, 10b) are expanded by about 100 nm and their depths are set to about 170 nm, by wet etching.

Subsequently, as shown in FIG. 6E, the second resist pattern 13d is removed by oxygen ashing and wet treatment, and the fundamental structure of a mask for exposure 16 according to this embodiment is completed.

Figure 6F:
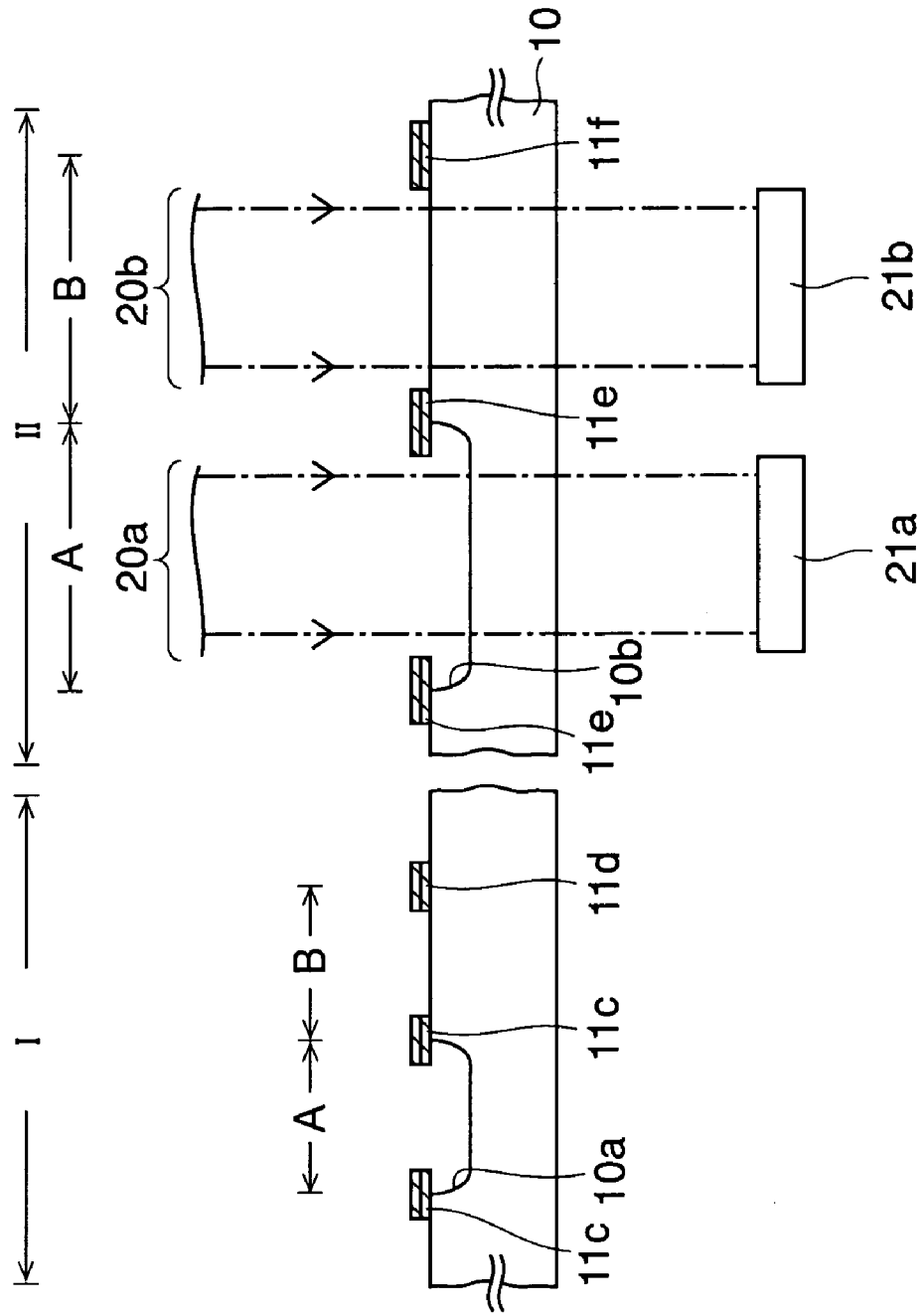

After completing the structure, as shown in FIG. 6F, by using the phase difference measurement system such as MPM248 manufactured by Lasertec Corporation, for example, the luminous fluxes (20a, 20b) from the ArF excimer laser are severally allowed to pass through the shifter portion A and the non-shifter portion B of the monitor region II, and the phase difference between luminous fluxes (20a, 20b) is measured by the light detection sections (21a, 21b) that are separately provided for each luminous flux (20a, 20b). Then, whether or not the above-described process is appropriate is determined depending on whether the phase difference is 180 degrees or not.

According to the present embodiment explained above, the overlap amount d4 between the first light-shielding monitor pattern 11e and the second resist pattern 13d is set to a value equal to or less than the overlap amount d3 between the first light-shielding device pattern 11c and the second resist pattern 13d, in the process shown in FIG. 6B.

With this configuration, the size relationship of the overlap amount d5 and d6 between each light-shielding pattern (11e, 11c) and the second resist pattern 13d becomes d6≦d5 that is equal to the one before the etching (d4≦d3) even after the side surface of the second resist pattern 13d has receded in the dry etching process of FIG. 6C.

Figure 7:
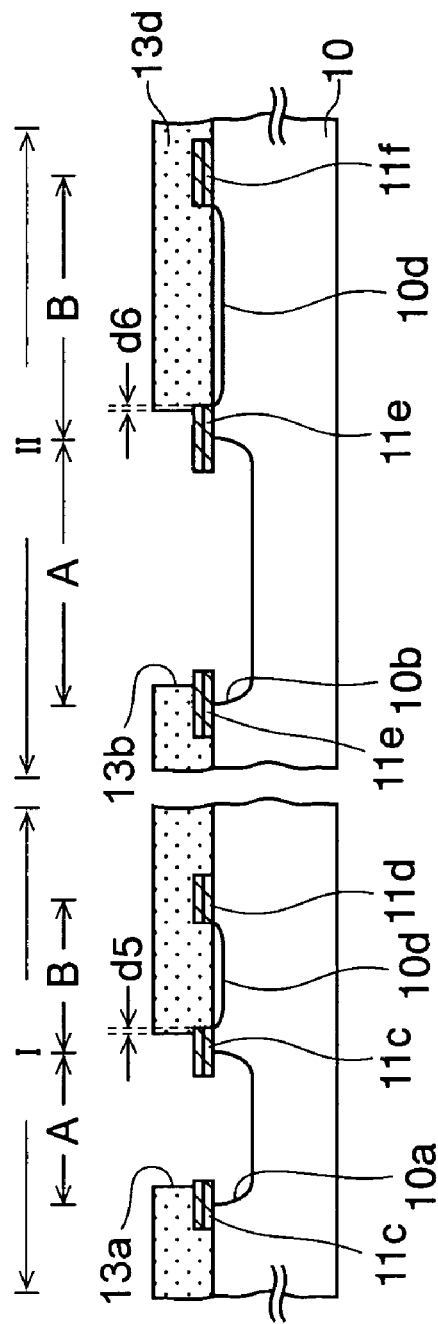
FIG. 7 is a sectional view showing that erosion occurs on a quartz substrate of both the device region I and the monitor region II in the mask for exposure according to the second embodiment of the present invention.

As a result, as shown in FIG. 7, even if the overlap amount d5 in the device region I becomes insufficient caused by the overall positional shift of the second resist pattern 13d and the non-shifter portion B of the device region I is etched to occur the erosion 10d in the wet etching process of FIG. 6B, for example, the overlap amount d6 in the monitor region II also becomes insufficient, so that the erosion 10d of the quartz substrate 10 occurs in the non-shifter portion B of the monitor region II.

Therefore, since the phase difference of the monitor region II becomes equal to the phase difference of the device region I even if the second resist pattern 13d has positional shift as described above, it is possible to know the phase difference of the device region I without fail by measuring the phase difference in the monitor region II.

Figure 8:
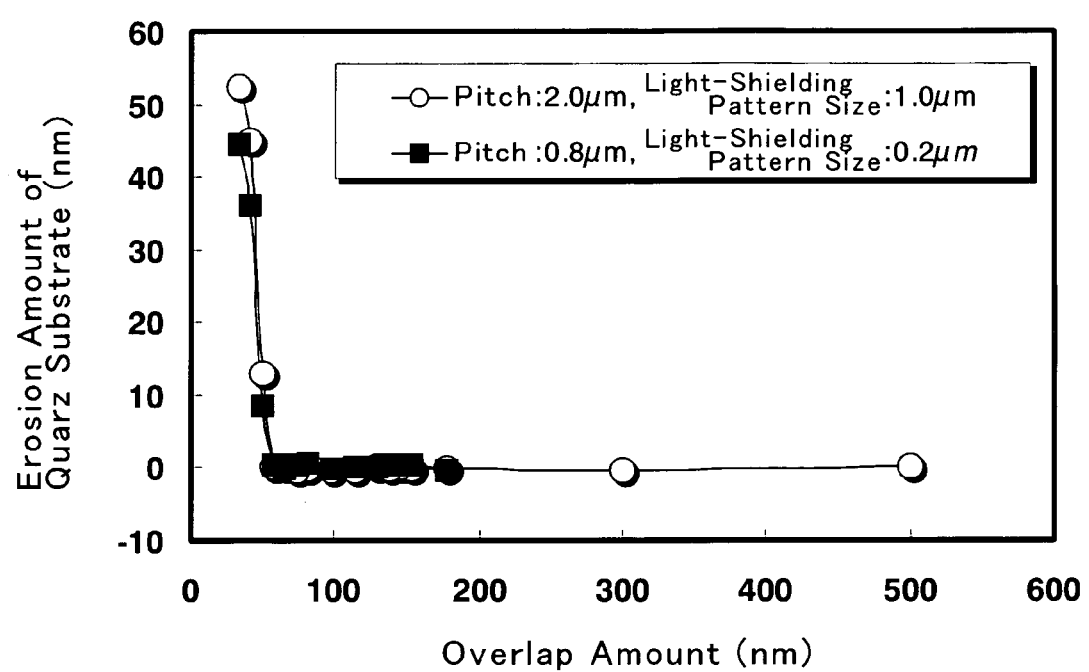
FIG. 8 is a graph showing the result of inspection to the changes of erosion amount of the quartz substrate in a non-shifter portion depending on the size of light-shielding pattern and pitch.

FIG. 8 is the graph showing the result of inspection to the changes of erosion amount (etching depth) of the quartz substrate 10 in the non-shifter portion B depending on the size of light-shielding pattern and pitch (center distance between patterns).

The axis of abscissas of FIG. 8 denotes the overlap amount between the light-shielding pattern and the resist pattern (corresponding to the above-described d3, d4), and the axis of ordinate denotes the value of the erosion amount (depth of erosion 10d) of the quartz substrate 10 caused by the infiltration of etchant, which has been measured by an AFM (Atomic Force Microscope).

In the inspection, a light-shielding pattern having the pitch of 2.0 μm and the size of 1.0 μm and a light-shielding pattern having the pitch of 0.8 μm and the size of 0.2 μm were inspected. The former light-shielding pattern is formed on the assumption of the first light-shielding monitor pattern 11e, and the latter is formed on the assumption of the gate electrode pattern of a logic device of 65 nm rule.

As shown in FIG. 8, the results matched excellently in both light-shielding patterns. The result made clear that the erosion amount of the quartz substrate 10 depended not on the layout of the light-shielding patterns (11c to 11f) but only on the overlap amount between the light-shielding patterns (11c to 11f) and the second resist pattern 13d.

(3) Third Embodiment

In the first embodiment described above, the size equal to or less than the size L1 of the first light-shielding device pattern 11c was employed as the size L2 of the first light-shielding monitor pattern 11e in the monitor region II, and when the erosion 10d of the quartz substrate 10 occurred in the non-shifter portion B of the device region I, the erosion 10d was allowed to occur in the non-shifter portion B of the device region I in the same manner. This could match the phase differences of the monitor region II and the device region I, and the phase difference of the monitor region II could guarantee the phase difference of the device region I.

However, if the phase difference of the monitor region II is actually shifted from 180 degrees, it is hard to determine whether such shift was caused by too much or too little etching to the second concave portion 10b or caused by the erosion 10d of the quartz substrate 10 in each region (I, II).

To facilitate the determination, the following mask for exposure is fabricated in this embodiment.

FIGS. 9A to 9E are the in-process sectional views of the mask for exposure according to this embodiment. In the drawings, reference numerals same as those of the first and second embodiments are attached to elements explained in the first embodiment, and their explanation will be omitted in the following.

Firstly, by performing the process of FIGS. 2A to 2D explained in the first embodiment, light-shielding patterns (11c to 11f) are formed on the quartz substrate 10 as shown in FIG. 9A. The light-shielding patterns (11c to 11f) are formed by patterning the light-shielding film 11, and two third light-shielding monitor patterns 11g and a fourth light-shielding monitor pattern 11h are further formed in the monitor region II, in this patterning process. Then, the two third light-shielding monitor patterns 11g are remote to each other at a fifth gap W5 wider than the first gap W1 between the first light-shielding device patterns 11c. On the other hand, the third light-shielding monitor pattern 11g and the fourth light-shielding monitor pattern 11h are remote from each other at a sixth gap W6 wider than the second gap W2 between the first light-shielding device pattern 11c and the second light-shielding device patterns 11d. The gaps (W5, W6) are not particularly limited as long as they satisfy the above conditions, and they are set to W5=2.0 μm and W6=2.0 μm.

By increasing the gaps (W5, W6) comparing to those of the device region I, the luminous fluxes from the optical phase difference measurement system can be prevented from bounced by each light-shielding pattern (11g, 11h) when measuring the phase difference by the system later.

Furthermore, the size L1 of the first light-shielding device pattern 11c and the size L2 of the first light-shielding monitor pattern 11e are not particularly limited as long as they are in L2≦L1 in the same manner as the first embodiment, and they are set to L1=L2=0.24 μm, for example.

Still further, the size L3 of the third light-shielding monitor pattern 11g is not particularly limited as well, and it is set to 2.0 μm, for example.

Next, by performing the same process as FIG. 2E explained in the first embodiment, the second resist pattern 13d is formed on each light-shielding pattern (11c to 11f).

In the process of forming the second resist pattern 13d, the second resist pattern 13d covers the fourth light-shielding monitor pattern 11h, and a third window 13c where a part of the top surface of the two third light-shielding monitor patterns 11g is exposed, is formed on the second resist pattern 13d.

Then, an overlap amount d7 between the third light-shielding monitor pattern 11g and the second resist pattern 13d is made larger than the overlap amount d3 with the first light-shielding device pattern 11c, and it is set to d7=1.8 μm, for example.

Thereafter, by performing the process of FIG. 2F explained in the first embodiment, the first and second concave portions for shifter (10a, 10b) having the depth of about 70 nm are formed on the quartz substrate 10 by dry etching, as shown in FIG. 9C.

In the process of forming the first and second concave portions (10a, 10b), dry etching is performed to the quartz substrate 10 through the third window 13c of the second resist pattern 13d to form a third concave portion 10c on the quartz substrate 10 between the two third light-shielding monitor patterns 11g.

Additionally, in the dry etching, the side surfaces of the first to third windows (13a to 13c) recede by $\Delta_3$ to $\Delta_5$ respectively by plasma in the etching atmosphere. The receding (gone-backward) amount ($\Delta_3$ to $\Delta_5$) is about 20 nm.

Then, due to the withdrawal of the first to third windows (13a to 13c), the overlap amount between the third light-shielding monitor pattern 11g and the second resist pattern 13d is reduced from the original overlap amount of d7 to d8 (=d7−$\Delta_5$).

Furthermore, a step 11m is formed by the dry etching on the top surface of the third light-shielding monitor pattern 11g, which has a second distance d8 longer than the distance d2 from the end surface of the third light-shielding monitor pattern 11g closer to the fourth light-shielding monitor pattern 11h, and the height of the top surface of the third light-shielding monitor pattern 11g of the area extending from the step 11m to the third concave portion 10c becomes lower.

Thereafter, by performing the process of FIG. 2G explained in the first embodiment, the side surfaces of the first to third concave portions (10a to 10c) are expanded by about 100 nm and their depths are set to about 170 nm, by wet etching as shown in FIG. 9D.

Subsequently, as shown in FIG. 9E, the second resist pattern 13d is removed by oxygen ashing and wet treatment, and the fundamental structure of a mask for exposure 17 according to this embodiment is completed.

Figure 10:
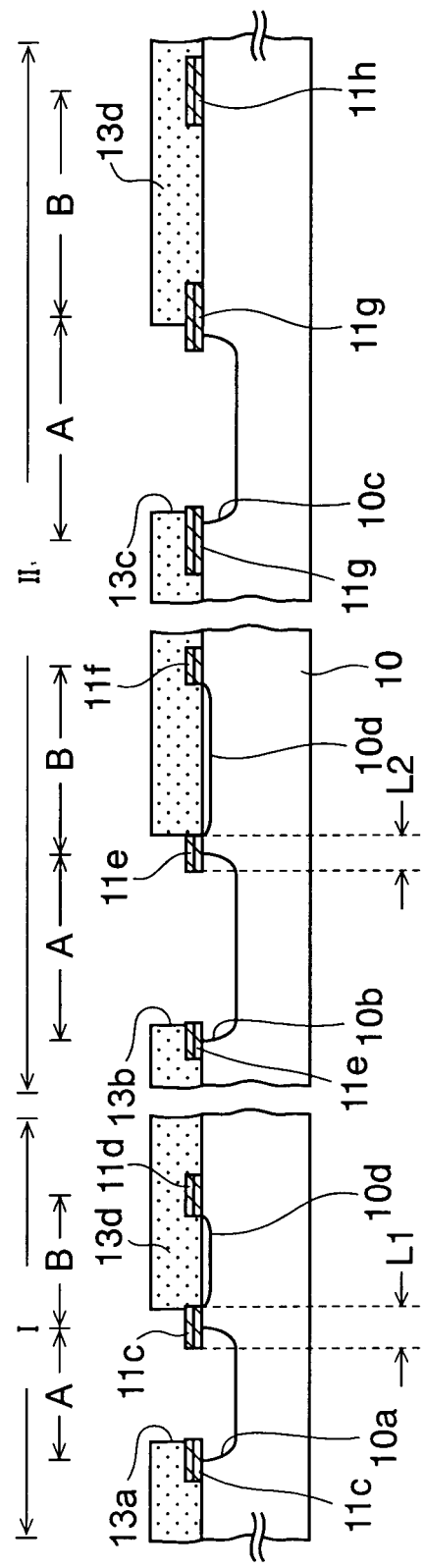
FIG. 10 is a sectional view of a case where a second resist pattern has a positional shift in the mask for exposure according to the third embodiment of the present invention.

Meanwhile, as explained in the first and second embodiments, when the second resist pattern 13d has overall positional shift as shown in FIG. 10 and the overlap amount between the second resist pattern 13d and the first light-shielding device pattern 11c becomes insufficient, etchant infiltrates the transparent substrate 10 of the non-shifter portion B of the device region I in the wet etching process of FIG.

9D, and the quartz substrate 10 of this area is etched as shown in the drawing to cause the erosion 10d.

Similarly, in the monitor region II, the erosion 10d also occurs on the quartz substrate of an area next to the first light-shielding monitor pattern 11e whose size L2 is equal to or less than the size L1 of the first light-shielding device pattern 11c, due to the insufficient overlap amount with the second resist pattern 13d.

On the other hand, in the same monitor region II, the overlap amount d7 between the third light-shielding monitor pattern 11g and the second resist pattern 13d (refer to FIG. 9B) is set to a larger value than the overlap amount d3 with the first light-shielding device pattern 11c. Therefore, sufficient overlap amount is secured between the third light-shielding monitor pattern 11g and the second resist pattern 13d even after the above-described positional shift of the second resist pattern 13d, so that etchant does not infiltrate the quartz substrate 10 between the third light-shielding monitor pattern 11g and the fourth light-shielding monitor pattern 11h, and no erosion occurs on the quartz substrate 10 of the area.

Particularly, as the overlap amount d7 between the third light-shielding monitor pattern 11g and the second resist pattern 13d, a value larger than the sum of the receding (gone-backward) amount $\Delta_5$ of the second resist pattern 13d, which is caused by the etching in the process of forming the first to third concave portions 10a to 10c, and a possible maximum positional shift of the second resist pattern 13d is employed to make it easier to prevent the infiltration of etchant.

Furthermore, it is possible to prevent the infiltration of etchant without fail by setting the overlap amount d7 to 200 μm or more.

In this embodiment, by utilizing with or without of the erosion 10d in the monitor region II, whether or not the erosion 10d exists in the device region I is determined as follows.

Figure 11A:
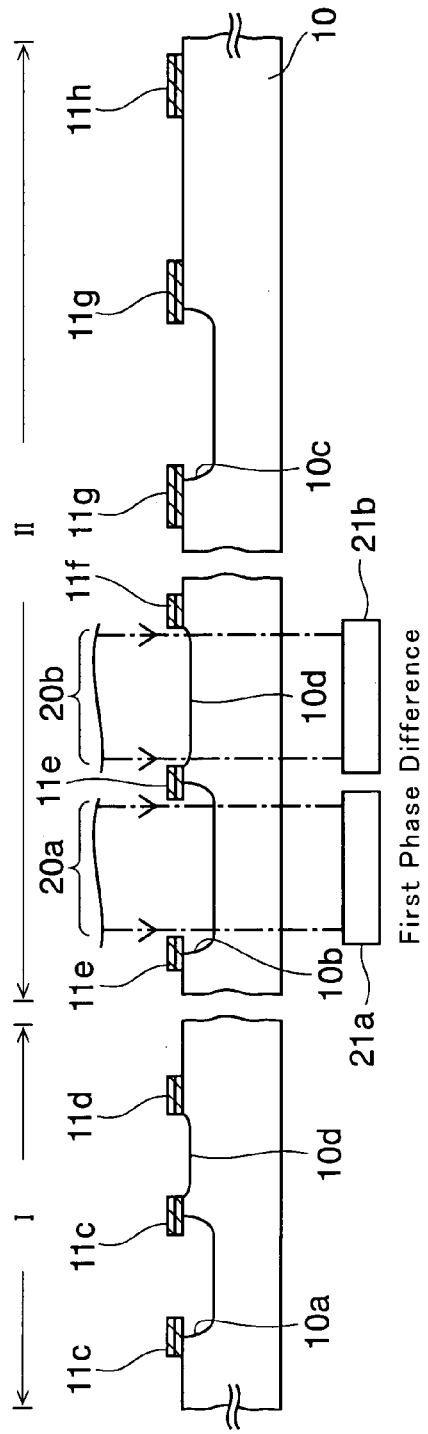
FIGS. 11A and 11B are sectional views in which a phase difference is measured by a phase difference measurement system in the mask for exposure according to the third embodiment of the present invention.

Firstly, as shown in FIG. 11A, by using the phase difference measurement system such as MPM248 manufactured by Lasertec Corporation, for example, the luminous fluxes (20a, 20b) from an ArF excimer laser are allowed to pass between the two first light-shielding monitor patterns 11e and between the first and second light-shielding monitor patterns (11e, 11f) respectively, and the light detection sections (21a, 21b) measure the phase difference between the luminous fluxes (20a, 20b) as a first phase difference.

Figure 11B:
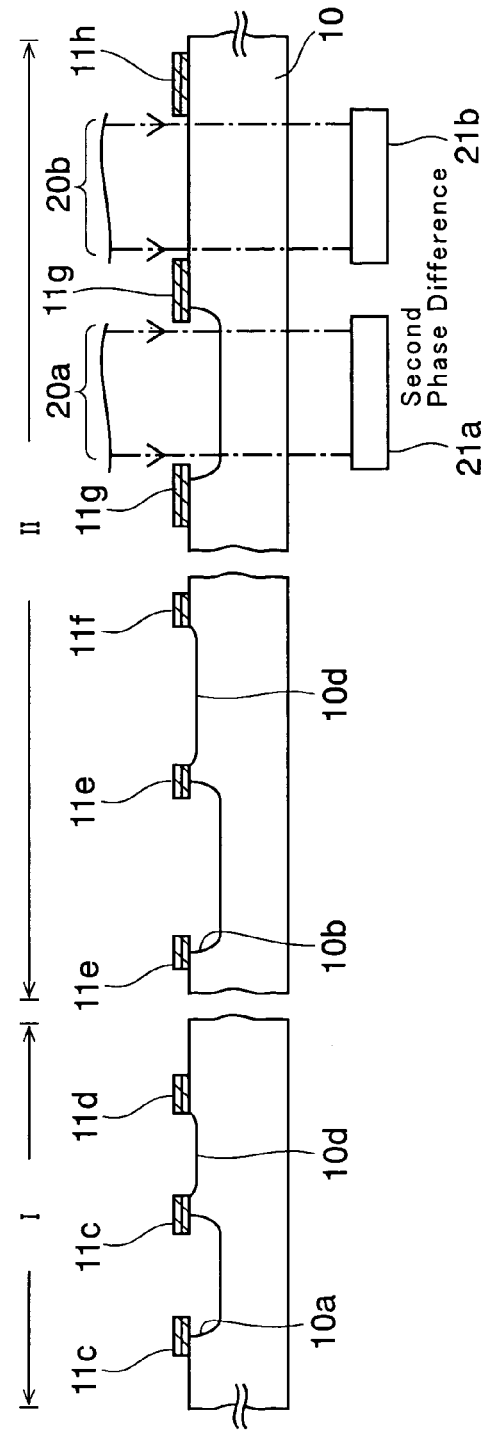

Subsequently, as shown in FIG. 11B, the above-described luminous fluxes (20a, 20b) are allowed to pass between the two third light-shielding monitor patterns 11g and between the third and fourth light-shielding patterns (11g, 11h), respectively, and the light detection sections measure the phase difference between the luminous fluxes as a second phase difference.

Since the depths of the second and third concave portions (10b, 10c) are equal, it can be determined that a difference of the phase difference has occurred due to the erosion 10d between the first light-shielding monitor pattern 11e and the second light-shielding monitor pattern 11f when the above-described first phase difference and the second phase difference are different.

On the other hand, when the second phase difference is equal to the first phase difference, it can be determined that the erosion 10d has not been occurred.

Accordingly, in the case where the first phase difference is shifted from 180 degrees and is in a value different from the second phase difference, it can be determined that the first phase difference has shifted from 180 degrees due to the erosion 10d.

Meanwhile, in the case where the first phase difference is equal to the second phase difference even if it is shifted from 180 degrees, it can be determined that the erosion 10d has not been occurred and the first phase difference has shifted from 180 degrees by too much or too little etching to the first to third concave portions (10a to 10c).

The inventors of the present invention conducted the following experiment to confirm the appropriateness of such determination.

In the experiment, the positional shift of the second resist pattern 13d was caused intentionally, and the phase difference in the device region I and the first and second phase differences in the monitor region II were measured.

Of these phase differences, because the phase difference in the device region I is difficult to measure by an optical phase difference measurement system that is generally used, the difference was derived from an optical image obtained by the simulation microscope MSM193 manufactured by Carl Zeiss Corporation.

As a result, both of the phase difference in the device region I and the first phase difference in the monitor region II became 175 degrees. On the other hand, the second phase difference in the monitor region II shifted from the value and became 180. As described, since the first phase difference and the second phase difference are different, it is considered that the erosion 10d has occurred between the first light-shielding monitor pattern 11e and the second light-shielding monitor pattern 11f.

Then, when the AFM actually measured the top surface of the quartz substrate 10, the erosion 10d occurred as shown in FIGS. 11A and 11B although the first to third concave portions were processed in a target depth.

As described above, since the erosion 10d does not occur when the first phase difference and the second phase difference in the monitor region II are the same, the mask for exposure 17 as designed can be obtained by performing additional processing such as digging down the depth of the first to third concave portions (10a to 10c) to a target value. However, when the first phase difference and the second phase difference are different, the erosion 10d has occurred and it is impossible to use the mask for exposure 17 again, so that it can be determined that the mask for exposure 17 be defective.

(4) Fourth Embodiment

In the third embodiment, by further forming the third and fourth light-shielding monitor patterns (11g, 11h) with respect to the mask for exposure explained in the first embodiment, determination of with or without the erosion 10d was made possible.

Such an advantage can be obtained when the third and fourth monitors 11g, 11h are formed on the mask for exposure of the second embodiment.

FIGS. 12A, 12B are the in-process sectional views of the mask for exposure according to this embodiment. In the drawings, reference numerals same as those of the first to third embodiments are attached to elements explained in these embodiments, and their explanation will be omitted in the following.

Firstly, by performing the process of FIGS. 6A and 6B explained in the second embodiment, the second resist pattern 13d is formed on the light-shielding patterns (11c to 11h) as shown in FIG. 12A.

In this embodiment, it is possible to set the size L2 of the first light-shielding monitor pattern 11e regardless of the size L1 of the first light-shielding device pattern 11c, similar to the second embodiment, and they are L2=2.0 μm and L1=0.24

μm, for example. Further, the size L3 of the third light-shielding monitor pattern 11g is not particularly limited, and it may be 2.0 μm similar to the third embodiment.

Furthermore, a value same as that of the first to third embodiments may be employed as the gaps (W1 to W6) between the light-shielding patterns (11c to 11h).

Moreover, the overlap amount (d3, d4) between the light-shielding patterns (11c, 11e) and the second resist pattern 13d are also not particularly limited as long as they are in d4≦d3 due to the reason explained in the second embodiment, and they are set to d3=d4=0.19 μm in this embodiment similar to the second embodiment.

On the other hand, the overlap amount d7 between the third light-shielding monitor pattern 11g and the second resist pattern 13d is made larger than the overlap amount d3 with the first light-shielding device pattern 11c in the same manner as the third embodiment, and it is 1.8 μm.

Thereafter, by performing the process of FIGS. 9C to 9E explained in the third embodiment, the fundamental structure of a mask for exposure 18 shown in FIG. 12B is completed.

In such a mask for exposure 18, the first phase difference and the second phase difference are measured in the monitor region II as described in FIGS. 11A and 11B, and with or without of the erosion 10d can be determined depending on whether or not the values are equal.

According to the present invention, since the pattern gap in the monitor region is wider than the pattern gap in the device region, luminous flux generated by the optical phase difference measurement system is difficult to be bounced by the first and second light-shielding monitor patterns, and measurement accuracy of the phase difference can be improved.

Further, the size of the first light-shielding monitor pattern is equal to or less than the size of the first light-shielding device pattern, and when erosion occurs on the transparent substrate in the device region, the erosion occurs in the monitor region as well. Thus, it is possible to guarantee the phase difference in the device region by the phase difference in the monitor region with good accuracy.

Alternatively, instead of the above method, it is possible to guarantee the phase difference with good accuracy when the resist pattern is formed so as to overlap the first light-shielding device patterns at the first overlap amount and overlap the first light-shielding monitor patterns at the second overlap amount smaller than the first overlap amount.

What is claimed is:

1. A mask for exposure, comprising:
a transparent substrate having a first concave portion in a device region and a second concave portion in a monitor region;
two first light-shielding device patterns, which are formed on said transparent substrate in said device region at a first gap and severally extend from the both sides of said first concave portion over the first concave portion, and at least one of the first light-shielding device patterns is not in contact with the first concave portion;
a second light-shielding device pattern, which is formed on a flat surface of said transparent substrate in said device region at a second gap from said first light-shielding device pattern;
two first light-shielding monitor patterns for measuring a phase difference of an exposure light, where the first light-shielding monitor patterns are formed on said transparent substrate in said monitor region at a third gap wider than said first gap and severally extend from the both sides of said second concave portion over the second concave portion, and at least one of the first light-shielding monitor patterns is not in contact with the second concave portion; and
a second light-shielding monitor pattern for measuring the phase difference of the exposure light, where the second light-shielding monitor pattern is formed on a flat surface of said transparent substrate in said monitor region at a fourth gap wider than said second gap from said first light-shielding monitor pattern, wherein
a width of said first light-shielding monitor pattern is equal to or less than a width of said first light-shielding device pattern.

2. The mask for exposure according to claim 1, wherein the width of said first light-shielding monitor pattern and the width of the first light-shielding device pattern are sizes in a same sectional plane.

3. The mask for exposure according to claim 1, wherein a first step is formed on the top surface of said first light-shielding device pattern, which has a first distance from an end surface of said first light-shielding device pattern closer to said second light-shielding device pattern, and the height of the top surface of said first light-shielding device pattern on a portion extending from the first step over said first concave portion is made lower than that on the other portion thereof, and
a second step is formed on the top surface of said first light-shielding monitor pattern, which has a second distance shorter than said first distance from an end surface of said first light-shielding monitor pattern closer to said second light-shielding monitor pattern and the height of the top surface of said first light-shielding monitor pattern on a portion extending from the second step over said second concave portion is made lower than that on the other portion thereof.

4. A mask for exposure, comprising:
a transparent substrate having a first concave portion in a device region and a second concave portion in a monitor region;
two first light-shielding device patterns, which are formed on said transparent substrate in said device region at a first gap and severally extend from the both sides of said first concave portion over the first concave portion, and at least one of the first light-shielding device patterns is not in contact with the first concave portion;
a second light-shielding device pattern, which is formed on a flat surface of said transparent substrate in said device region at a second gap from said first light-shielding device pattern;
two first light-shielding monitor patterns for measuring a phase difference of an exposure light, where the first light-shielding monitor patterns are formed on said transparent substrate in said monitor region at a third gap wider than said first gap and severally extend from the both sides of said second concave portion over the second concave portion, and at least one of the first light-shielding monitor patterns is not in contact with the second concave portion; and
a second light-shielding monitor pattern for measuring the phase difference of the exposure light, where the second light-shielding monitor pattern is formed on a flat surface of said transparent substrate in said monitor region at a fourth gap wider than said second gap from said first light-shielding monitor pattern, wherein
a first step is formed on the top surface of said first light-shielding device pattern, which has a first distance from an end surface of said first light-shielding device pattern closer to said second light-shielding device pattern, and the height of the top surface of said first light-shielding device pattern on a portion extending from the first step over said first concave portion is made lower than a height of a portion of said first light-shielding device pattern closer to said end surface, and a second step is formed on the top surface of said first light-shielding monitor pattern, which has a second distance shorter than said first distance from an end surface of said first light-shielding monitor pattern closer to said second light-shielding monitor pattern, and the height of the top surface of said first light-shielding monitor pattern on a portion extending from the second step over said second concave portion is made lower than a height of a portion of said first light-shielding monitor pattern closer to said end surface.

5. The mask for exposure according to any one of claims 3 and 4, further comprising:

two third light-shielding monitor patterns, which are formed severally extending from the both sides of a third concave portion formed on said transparent substrate in said monitor region and formed at a fifth gap wider than said first gap; and a fourth light-shielding monitor pattern formed on a flat surface of said transparent substrate in said monitor region at a sixth gap wider than said second gap from said third light-shielding monitor pattern, wherein a third step is formed on the top surface of said third light-shielding monitor pattern, which has a third distance longer than said second distance from an end surface of said third light-shielding monitor pattern closer to said fourth light-shielding monitor pattern, and the height of the top surface of said third light-shielding monitor pattern on a portion extending from the third step over said third concave portion is made lower than that on the other portion.

6. A method of manufacturing a mask for exposure, comprising:

forming a light-shielding film on a transparent substrate;

patterning said light-shielding film to form, in the device region of said transparent substrate, two first light-shielding device patterns at a first gap and a second light-shielding device pattern at a second gap from the first light-shielding device pattern, and to form, in the monitor region of said transparent substrate, two first light-shielding monitor patterns, which have a third gap wider than said first gap and have a width equal to or less than a width of said first light-shielding device pattern, and a second light-shielding monitor pattern at a fourth gap wider than said second gap from the first light-shielding monitor pattern;

forming a resist pattern that covers said second light-shielding device pattern and said second light-shielding monitor pattern and has a first window where a part of the top surface of said two first light-shielding device patterns is exposed and a second window where a part of the top surface of said two first light-shielding monitor patterns is exposed;

etching said transparent substrate through said first and second windows to form a first concave portion on said transparent substrate between said two first light-shielding device patterns and to form a second concave portion on said transparent substrate between said two first light-shielding monitor patterns;

performing wet etching to said transparent substrate through said first and second windows to expand widths of said first and second concave portions, and thus to extend said first light-shielding device patterns over said first concave portion and to extend said first light-shielding monitor patterns over said second concave portion, with at least one of the first light-shielding device patterns not in contact with the first concave portion, and at least one of the first light-shielding monitor patterns not in contact with the second concave portion;

removing said resist pattern; and allowing light pass through said second concave portion between said two first light-shielding monitor patterns and through the transparent substrate between said first light-shielding monitor pattern and said second light-shielding monitor pattern to measure the phase difference of transmitted light between said second concave portion and said substrate as a first phase difference, and then confirming whether or not the first phase difference is 180 degrees.

7. The method of manufacturing a mask for exposure according to claim 6, wherein widths measured in a same sectional plane are employed as the width of said first light-shielding device pattern and the width of the first light-shielding monitor pattern.

8. A method of manufacturing a mask for exposure, comprising:

forming a light-shielding film on a transparent substrate;

patterning said light-shielding film to form, in the device region of said transparent substrate, two first light-shielding device patterns at a first gap and a second light-shielding device pattern at a second gap from the first light-shielding device pattern, and to form, in the monitor region of said transparent substrate, two first light-shielding monitor patterns at a third gap wider than said first gap and a second light-shielding monitor pattern at a fourth gap wider than said second gap from the first light-shielding monitor pattern;

forming a resist pattern that covers said second light-shielding device pattern and said second light-shielding monitor pattern and has a first window where top surfaces of said two first light-shielding device patterns are exposed and a second window where top surfaces of said two first light-shielding monitor patterns are exposed, and that overlaps said first light-shielding device pattern with a first overlap amount and overlaps said first light-shielding monitor pattern with a second overlap amount smaller than said first overlap amount;

etching said transparent substrate through said first and second windows to form a first concave portion on said transparent substrate between said two first light-shielding device patterns and to form a second concave portion on said transparent substrate between said two first light-shielding monitor patterns;

performing wet etching to said transparent substrate through said first and second windows to expand the width of said first and second concave portions and thus to extend said first light-shielding device patterns over said first concave portion and to extend said first light-shielding monitor patterns over said second concave portion, with at least one of the first light-shielding device patterns not in contact with the first concave portion, and at least one of the first light-shielding monitor patterns not in contact with the second concave portion;

removing said resist pattern; and allowing light pass through said second concave portion between said two first light-shielding monitor patterns and through the transparent substrate between said first light-shielding monitor pattern and said second light-shielding monitor pattern to measure the phase difference of transmitted light between said second concave portion and said substrate as a first phase difference and then confirming whether or not the first phase difference is 180 degrees.

9. The method of manufacturing a mask for exposure according to any one of claim 6 and 8, said method further comprising:
when patterning said light-shielding film, forming two third light-shielding monitor patterns at a fifth gap wider than said first gap and a fourth light-shielding monitor pattern at a sixth gap wider than said second gap from the third light-shielding monitor pattern in the monitor region of said transparent substrate;
when forming said resist pattern, covering said fourth light-shielding monitor pattern by said resist pattern and forming in said resist pattern a third window where parts of the top surfaces of said two third light-shielding monitor patterns are exposed, and the overlap amount between said third light-shielding monitor pattern and said resist pattern is made larger than the overlap amount between said first light-shielding device pattern and said resist pattern;
when forming said first and second concave portions, etching said transparent substrate through said third window to form a third concave portion on said transparent substrate between said two third light-shielding monitor patterns;
when expanding the width of said first and second concave portions, expanding the width of said third concave portion to extend said third light-shielding monitor patterns over said third concave portion; and
allowing light to pass through said third concave portion between said two third light-shielding monitor patterns and through the transparent substrate between said third light-shielding monitor pattern and said fourth light-shielding monitor pattern to measure the phase difference of transmitted light between said third concave portion and said substrate as a second phase difference, and then determining whether or not erosion is caused on said transparent substrate when expanding said first to third concave portions by evaluating whether or not said first phase difference and said second phase difference are the same.

10. The method of manufacturing a mask for exposure according to claim 9, wherein
a value larger than the sum of the gone-backward amount of said resist pattern, which is caused by etching in the process of forming said first to third concave portions, and a maximum positional shift amount of said resist pattern is employed as the overlap amount between said third light-shielding monitor pattern and said resist pattern.

11. The method of manufacturing a mask for exposure according to claim 9, wherein
a value equal to or more than 200 nm is employed as the overlap amount between said third light-shielding monitor pattern and said resist pattern.

12. The mask for exposure according to any one of claims 1 and 4, wherein the mask is a Levenson phase shift mask.

13. The method of manufacturing a mask for exposure according to any one of claims 6 and 8, wherein the mask is a Levenson phase shift mask.

14. The mask for exposure according to claim 1, wherein the monitor region is provided in a peripheral region of the transparent substrate, where the peripheral region surrounds the device region.

15. The mask for exposure according to claim 4, wherein the monitor region is provided in a peripheral region of the transparent substrate, where the peripheral region surrounds the device region.

* * * * *